(12) United States Patent
Bashore

(10) Patent No.: US 11,379,631 B2
(45) Date of Patent: *Jul. 5, 2022

(54) SYSTEMS AND METHODS FOR ALLOCATING HYDROCARBON PRODUCTION VALUES

(71) Applicant: Enverus, Inc., Austin, TX (US)

(72) Inventor: William M. Bashore, Denver, CO (US)

(73) Assignee: Enverus, Inc., Austin, TX (US)

( * ) Notice: Subject to any disclaimer, the term of this patent is extended or adjusted under 35 U.S.C. 154(b) by 233 days.

This patent is subject to a terminal disclaimer.

(21) Appl. No.: 16/418,019

(22) Filed: May 21, 2019

(65) Prior Publication Data

US 2019/0272353 A1    Sep. 5, 2019

Related U.S. Application Data

(63) Continuation of application No. 15/247,097, filed on Aug. 25, 2016, now Pat. No. 10,303,819.

(51) Int. Cl.
    *E21B 43/16*    (2006.01)
    *G06F 30/20*    (2020.01)
    (Continued)

(52) U.S. Cl.
    CPC .......... *G06F 30/20* (2020.01); *E21B 41/0092* (2013.01); *E21B 43/00* (2013.01);
    (Continued)

(58) Field of Classification Search
    CPC ...... E21B 41/0092; E21B 43/14; E21B 43/00; E21B 43/017; E21B 43/16; G06F 30/20
    See application file for complete search history.

(56) References Cited

U.S. PATENT DOCUMENTS 4,442,710 A    4/1984    Meng
4,908,763 A *  3/1990    Sundberg ............... G01V 8/02
                                                      250/253
(Continued)

FOREIGN PATENT DOCUMENTS

JP    2013-528731    7/2013
WO   WO2002086277   10/2002
WO   WO2008070864    6/2008

OTHER PUBLICATIONS

Texas Allocated Production Data, 5 pages, (Year: 2016).*

(Continued)

*Primary Examiner* — Kibrom K Gebresilassie
(74) *Attorney, Agent, or Firm* — Fish & Richardson P.C.

(57) ABSTRACT

Techniques for allocating hydrocarbon production include receiving a selection of a particular area identification (ID) of a plurality of area IDs stored on the server; determining based on the selected particular area ID, a plurality of hydrocarbon production values that include periodic area-level hydrocarbon production values associated with the particular area ID and a plurality of wells associated with the particular area ID; determining a decline curve model for the area-level hydrocarbon production values associated with the particular area ID; modeling the aggregated periodic well-level hydrocarbon production values with the determined decline curve model; and determining allocated well-level hydrocarbon production values based at least in part on the selected decline curve model to display at a client device.

45 Claims, 13 Drawing Sheets

(51) Int. Cl.
  *E21B 43/00* (2006.01)
  *E21B 43/017* (2006.01)
  *E21B 41/00* (2006.01)
  *E21B 43/14* (2006.01)

(52) U.S. Cl.
  CPC ............ *E21B 43/017* (2013.01); *E21B 43/14* (2013.01); *E21B 43/16* (2013.01)

(56) References Cited

U.S. PATENT DOCUMENTS

| | | |
|---|---|---|
| 7,289,942 B2 | 10/2007 | Yang et al. |
| 7,346,457 B2 | 3/2008 | Jalali et al. |
| 7,627,461 B2 | 12/2009 | Guyaguler et al. |
| 8,069,018 B2 | 11/2011 | Horowitz et al. |
| 8,473,268 B2 | 6/2013 | Benish et al. |
| 8,756,038 B2 | 6/2014 | Rossi et al. |
| 9,140,108 B2 | 9/2015 | Shirzadi et al. |
| 10,303,819 B2 | 5/2019 | Bashore |
| 2006/0116856 A1 | 6/2006 | Webb |
| 2009/0012765 A1 | 1/2009 | Raphael |
| 2009/0020284 A1 | 1/2009 | Graf et al. |
| 2009/0198478 A1 | 8/2009 | Cuevas et al. |
| 2010/0023269 A1 | 1/2010 | Yusti |
| 2011/0297370 A1 | 12/2011 | Michael |
| 2012/0095733 A1 | 4/2012 | Rossi |
| 2013/0018587 A1 | 1/2013 | Clark |
| 2013/0245953 A1 | 9/2013 | Gonzales et al. |
| 2014/0297235 A1 | 10/2014 | Arora et al. |
| 2014/0310071 A1 | 10/2014 | Conradson et al. |
| 2015/0019145 A1 | 1/2015 | Sibblad |
| 2015/0134620 A1 | 5/2015 | Crafton |
| 2016/0153266 A1 | 2/2016 | Rashid |
| 2016/0063402 A1 | 3/2016 | Webb et al. |
| 2017/0177992 A1 | 6/2017 | Klie |
| 2018/0202264 A1 | 7/2018 | Sarduy |
| 2019/0362039 A1* | 11/2019 | Bashore .............. E21B 41/0092 |

OTHER PUBLICATIONS

"Texas Allocated Production Data", 5 pages, 2016 (Year: 2016).*
PCT International Search Report and Written Opinion in International Appln. No. PCT/US2020/045133, dated Nov. 11, 2020, 14 pages.
"NavPort Releases Completion-based Production Model," Feb. 9, 2016 [retrieved Jun. 16, 2016]. Retrieved from the Internet: URL http://www.businesswire.com/news/home/20160209006174/en/NavPort_Releases_Completion_based_Production_Model 3 pages.
"NavPort: New Production Allocation Model!" [retrieved Jun. 16, 2016]. Retrieved from the Internet: URL https://navport.wistia.com/medias/xzt60vfwnj 1 page.
"Teaxs Allocated Production data" pp. 1-11, 2015 (Year:2015).
Bruce Smith and Dick Catto. "Allocated Production White Paper" Texas Allocated Production, Mar. 2015, 55 pages.
Emanuel Martin [online]. "Behavior of ARPS Equation in Shale Plays," Mar. 30, 2015 [retrieved Jun. 2016-241. Retrieved from the Internet: URL inips://www.linkedin.coni/pulselbeliavior-arpsequation-sliale-plavs-emanuel-inartin 13 pages.
Texas Allocated Production Data [retrieved Aug. 25, 2016]. Retrieved from the Internet: URL https://info.drillinginfo.com/wp-content/uploads/2015/09/RG_DI-Desktop-TX-Allocated_Q315-04Final-web.pdf, 5 pages.
Written Opinion of the International Searching Authority (6 pages) and International Search Report (3 pages) for International Application No. PCT/US2017/048563, dated Dec. 20, 2017.

* cited by examiner

SYSTEMS AND METHODS FOR ALLOCATING HYDROCARBON PRODUCTION VALUES

CROSS-REFERENCE TO RELATED APPLICATION

This application is a continuation application of, and claims priority under 35 U.S.C. § 120 to, U.S. patent application Ser. No. 15/247,097, filed on Aug. 25, 2016, now U.S. Pat. No. 10,303,819, the entire contents of which is incorporated by reference herein.

TECHNICAL FIELD

This document relates to systems and methods for allocating hydrocarbon production values and, more particularly, allocating area-level, or lease-level, hydrocarbon production values to one or more hydrocarbon wells located on the area or lease.

BACKGROUND

Periodic hydrocarbon (e.g., oil, gas) and water production from producing wells are reported to state agencies (e.g., the Texas Railroad Commission) for recordal and informational purposes. Often, the reported hydrocarbon and water production is reported as an aggregated value for a particular geographic or legally-defined area. Within the particular geographic or legally-defined area, there may be many producing wells that contribute to the aggregated periodic reported values. That is, whether the area includes a single well or many wells, only aggregated production values are reported. For multi-well areas, it may be difficult to determine periodic production values on a well-by-well basis. For example, allocation of the aggregated periodic values among the multiple wells may be dependent, for example, on which wells are producing when and for how long.

SUMMARY

In an example implementation for allocating hydrocarbon production, a computer-implemented method includes (i) receiving, from a client device communicably coupled to a server that includes one or more processors, a selection of a particular area identification (ID) of a plurality of area IDs stored on the server; (ii) determining, with the one or more processors, based on the selected particular area ID, a plurality of hydrocarbon production values that include periodic area-level hydrocarbon production values associated with the particular area ID and a plurality of wells associated with the particular area ID; (iii) determining, with the one or more processors, a decline curve model for the area-level hydrocarbon production values associated with the particular area ID; (iv) modeling, with the one or more processors, the aggregated periodic well-level hydrocarbon production values with the determined decline curve model; and (v) determining, with the one or more processors, allocated well-level hydrocarbon production values based at least in part on the selected decline curve model to display at the client device.

In an aspect combinable with the example implementation, determining a decline curve model for the area-level hydrocarbon production values associated with the particular area ID includes determining the decline curve model for the area-level hydrocarbon production values associated with the particular area ID based, at least in part, on a geology of a reservoir associated with the area ID.

In another aspect combinable with any of the previous aspects, determining a decline curve model for the area-level hydrocarbon production values associated with the particular area ID based, at least in part, on a geology of a reservoir associated with the area ID includes (vi) determining, with the processor, allocated periodic well-level hydrocarbon production values for each of the plurality of wells associated with the particular area ID; (vii) shifting, with the processor, the allocated periodic well-level hydrocarbon production values for each of the plurality of wells to an initial time period; (viii) aggregating, with the processor, the shifted allocated periodic well-level hydrocarbon production values to generate aggregated periodic area-level hydrocarbon production values; and (ix) determining the decline curve model for the area-level hydrocarbon production values associated with the particular area ID based on the aggregated periodic well-level hydrocarbon production values.

Another aspect combinable with any of the previous aspects further includes determining a number of periods associated with the particular area ID; determining a first period of the number of periods, the first period associated with a first area-level hydrocarbon production value; and determining a last period of the number of periods, the last period associated with a last area-level hydrocarbon production value.

Another aspect combinable with any of the previous aspects further includes selecting a period of the number of periods, starting with the first period and ending with the last period; for the selected period, determining a total number of wells associated with the particular area ID; and for the selected period, determining a number of active wells associated with the particular area ID.

Another aspect combinable with any of the previous aspects further includes, based on the number of active wells being one active well in the selected period, assigning an area-level hydrocarbon production value in the selected period to the one active well.

Another aspect combinable with any of the previous aspects further includes, based on the number of active wells being more than one active well, for each active well in the selected period determining that the active well has pending production in the selected period; and based on the active well having pending production in the selected period, assigning the pending preproduction to the active well.

Another aspect combinable with any of the previous aspects further includes determining that the active well has no pending production in the selected period; based on the active well having no pending production in the selected period, determining that the active well has an assigned decline curve model; and based on the active well having the assigned decline curve model, determining a predicted production for the selected period for the active well.

Another aspect combinable with any of the previous aspects further includes based on the selected period being subsequent to the first period, determining that the active well is associated with a predicted production from the assigned decline curve model from a previous period in the number of periods; proportioning the predicted production of the active well for the selected period based on the predicted production of the active well for the previous period; and assigning the proportioned predicted production to the active well for the selected period.

Another aspect combinable with any of the previous aspects further includes determining that the active well has no pending production in the selected period and no assigned decline curve model; and based on the determination, flagging the active well as a new well for the selected period.

Another aspect combinable with any of the previous aspects further includes, for each new well in the selected period determining a sum of pending production for the active wells in the selected period and the predicted production for the active wells in the selected period; determining that the sum is greater than the area-level hydrocarbon production value for the selected period; equalizing the sum of predicted production for the active wells in the selected period and the predicted production for the active wells in the selected period with the area-level hydrocarbon production value for the selected period; and assigning zero production to each new well for the selected period.

Another aspect combinable with any of the previous aspects further includes determining that the sum is less than the area-level hydrocarbon production value for the selected period; and determining a difference between the sum of predicted production for the active wells in the selected period and the predicted production for the active wells in the selected period and the area-level hydrocarbon production value for the selected period; and assigning, to each of the new wells in the selected period, a proportional hydrocarbon production value based on the difference.

Another aspect combinable with any of the previous aspects further includes, for each new well in the selected period determining that the assigned proportional hydrocarbon production value to the new well in the selected period is less than an assigned proportional hydrocarbon production value to the new well in a previous period; identifying well test data associated with the new well; and based on the identified well test data, fitting the decline curve model to the new well based at least in part on the well test data and the assigned proportional hydrocarbon production values of the new well in the selected period and the previous period.

Another aspect combinable with any of the previous aspects further includes identifying no well test data associated with the new well; and based on the identification of no well test data associated with the new well, fitting the decline curve model to the new well.

Another aspect combinable with any of the previous aspects further includes adjusting the decline curve model for the new well based, at least in part, on the assigned proportional hydrocarbon production value of the new well in the previous period.

Another aspect combinable with any of the previous aspects further includes identifying no new wells in the selected period; and based on the identification of no new wells in the selected period and based on the selected period being the first period, assigning a proportioned predicted production to the active well for the selected period, the proportioned predicted production based on the decline curve model and the number of active wells.

In another aspect combinable with any of the previous aspects, the time period includes a month.

In another aspect combinable with any of the previous aspects, the decline curve model includes an Arp's equation decline curve model.

In another aspect combinable with any of the previous aspects, the decline curve model is defined, at least in part, by a maximum periodic hydrocarbon production value and at least one decline rate.

In another aspect combinable with any of the previous aspects, the at least one decline rate includes an initial decline rate and a decline rate over time.

Another aspect combinable with any of the previous aspects further includes performing an iterative process of determining the allocated well-level hydrocarbon production values by iterating steps (vi)-(ix).

In another aspect combinable with any of the previous aspects, iterating steps (vi)-(ix) includes determining new allocated periodic well-level hydrocarbon production values for each of the plurality of wells based on the determined allocated well-level hydrocarbon production values in a previous iteration of step (v); shifting the new allocated periodic well-level hydrocarbon production values for each of the plurality of wells to a first period of a number of periods associated with the particular area ID; aggregating the shifted new allocated periodic well-level hydrocarbon production values to generate new aggregated periodic area-level hydrocarbon production values; and determining a new decline curve model for the new aggregated periodic area-level hydrocarbon production values.

In another aspect combinable with any of the previous aspects, an area ID includes a lease ID.

Implementations may also include systems or computer programs. For example, a system of one or more computers can be configured to perform particular actions by virtue of having software, firmware, hardware, or a combination of them installed on the system that in operation causes or cause the system to perform the actions. One or more computer programs can be configured to perform particular actions by virtue of including instructions stored on non-transitory computer-readable media that, when executed by data processing apparatus, cause the apparatus to perform the actions.

One, some, or all of the implementations according to the present disclosure may include one or more of the following features. For example, a computer-implemented allocation model may use a deterministic model of expected decline for each well among multiple producing wells in a particular area or lease in order to allocate production values on a well-by-well basis from an aggregated reported hydrocarbon (or water) production. The allocation model may reduce or eliminate artifacts within the aggregated reported production, such as sudden changes in month-to-month production (e.g., spikes, zero-values) that can be interpreted as operation events (e.g., recompletions, shut-ins) where none actually exist. Thus, the allocation model may more accurately determine actual well-by-well production values on a periodic basis based on reported aggregated production. Further, the allocation model may more accurately produce estimated ultimate recovery forecasts (EURs) relative to conventional allocation techniques. As another example, the allocation model may, by using a deterministic model, incorporates the concept that a local petroleum geology of the producing reservoir has predictive value in allocating aggregated hydrocarbon production values to individual wells contributing to those aggregated values.

One, some, or all of the implementations according to the present disclosure may include one or more of the following features. For example, the computer-implemented allocation model may increase efficiencies (e.g., in computing time and resources) relative to conventional allocation techniques by providing for an iterative process that more quickly (e.g., within a couple or several iterations) reaches allocation values very close to final values. As another example, the computer-implemented allocation model may increase efficiencies (e.g., in computing time and resources) by improving the understanding of the change in a decline curve model over time as well spacing decreases. This time-dynamic modeling is then used in economic analysis of well planning.

As another example, the computer-implemented allocation model may improve estimates of ultimate recovery or remaining recoverables at a specific future time, which may in turn provide for more efficient economic planning of future wells. As another example, the computer-implemented allocation model may improve an understanding of the impact of the reservoir geology on the economic recovery of hydrocarbons. Also, the computer-implemented allocation model may improve an understanding of remaining recoverable hydrocarbons within a given resource play (e.g., given formation, lease, or otherwise).

The details of one or more embodiments are set forth in the accompanying drawings and the description below. Other features, objects, and advantages will be apparent from the description and drawings, and from the claims.

DETAILED DESCRIPTION

Figure 1:
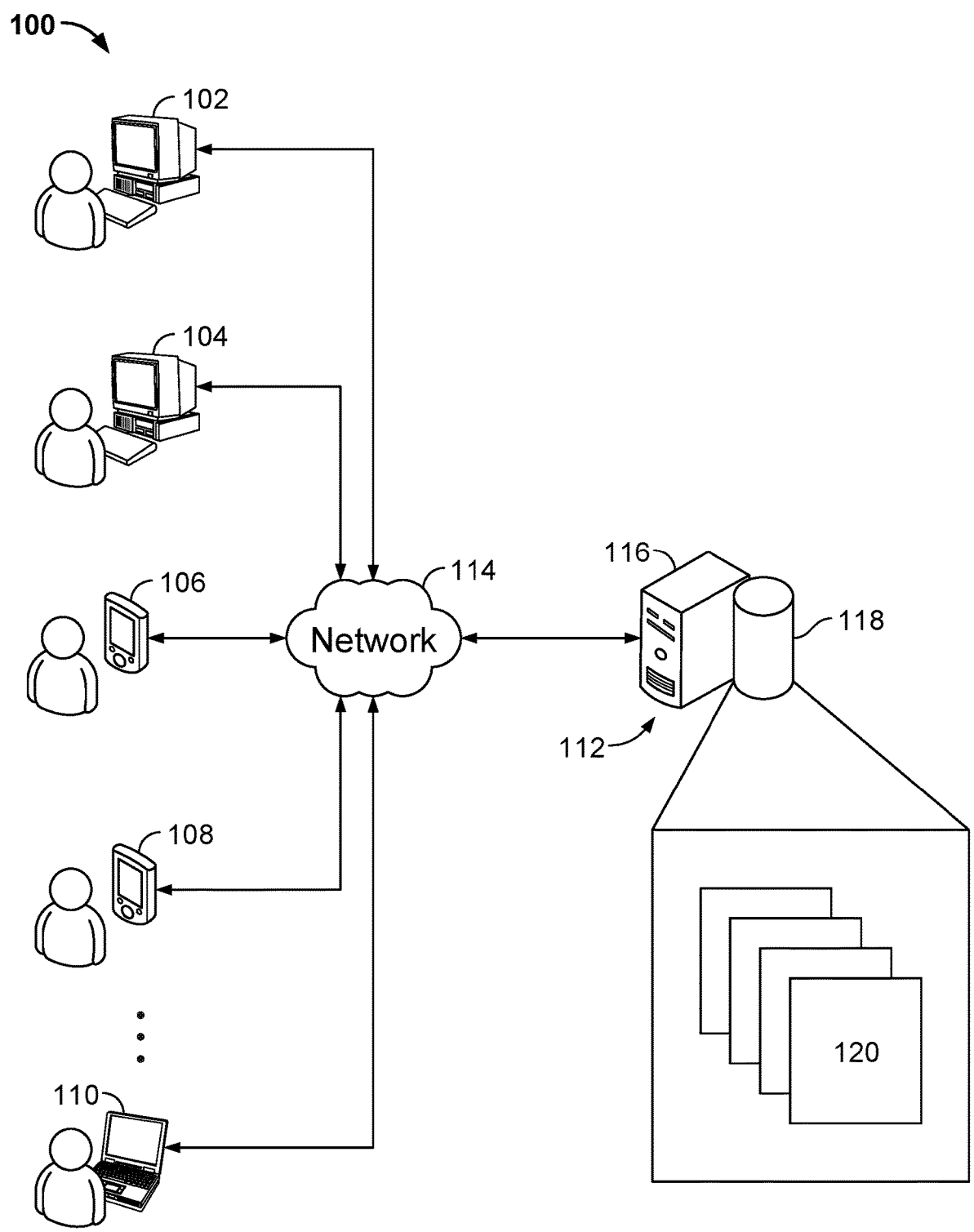
FIG. 1 illustrates an example distributed network architecture that includes one or more client devices and one or more server devices that execute an allocation model according to the present disclosure.

This document discusses techniques (e.g., computer-implemented method, computer program product, computer system) for executing an allocation model that determines allocated hydrocarbon production on a well-by-well and periodic basis from reported aggregated lease-level production. In some aspects, the allocation model according to the present disclosure may use a deterministic model of expected decline for each well within multiple wells assigned to or associated with a particular area. In some aspects, an "area" may represent an arbitrary geographic area, e.g., selected by or defined by a user, operator, or owner of an allocation model service that executes the allocation model. In other aspects, an "area" may represent or coincide with a legally defined geographic area, e.g., a county, a township, a state, a city, or multiples thereof. In other aspects, an "area" may represent a hydrocarbon lease. In turn, a hydrocarbon lease may generally represent or define an area of surface land on which exploration or production activity of hydrocarbons, water, or both hydrocarbons and water, occurs. In some aspects, a hydrocarbon lease may represent or define a contractually defined area that conveys rights to explore and produce from an owner of mineral rights in that area (lessor) to a tenant (lessee), usually for a fee and with a specified duration.

In some aspects, the allocation model may receive or identify several data inputs. The data inputs may be stored (e.g., historical or gathered data) or provided (e.g., by a user or operator of the allocation model service). The data inputs may include, for example, reported aggregated hydrocarbon (or water) well production for an area, the first and last hydrocarbon production periods (e.g., time) for each well associated with the area, and pending production reported for each well associated with the area. Pending production values may include periodic hydrocarbon production values for one or more wells in one or more periods prior to such wells being associated with the area (e.g., prior to the wells being legally assigned to a lease).

Certain data, e.g., the reported aggregated hydrocarbon production values, may be segmented by time period, or "period." In some aspects, a period may represent one month. In alternative aspects, a period may be a shorter period of time (e.g., a week, a day) or a longer period of time (e.g., a year, multiple months or years).

In some aspects, data inputs to the allocation model may also include well-test data. Such well-test data, reported on a well-by-well basis (if available) for the wells associated with the area may be reported after completion/recompletion operations and/or on irregular intervals (e.g., Railroad Commission of the State of Texas Form W-10, Oil Well Status Report). Typically, these data represent measured hydrocarbon production data over a 24 hour period. Extrapolating such daily production data to a full month value may be potentially indicative of monthly production, but may not be completely accurate. In some aspects, the allocation model may account for this imperfection while still honoring the reported well-test data, along with the pending production values associated with the area.

The allocation model may utilize a deterministic decline curve to allocate hydrocarbon production values on a well-by-well basis, based on reported aggregated hydrocarbon production values associated with a particular area (e.g., lease). For example, the allocation model may use the Arp's equation or other decline equation (e.g., Duong, Power Law, Logistic Growth, Stretched Exponential, or otherwise). The selected decline equation (e.g., Arp's or otherwise) may be characterized by one or more criteria. For example, in the case of Arp's equation, a selected or modeled decline curve may be characterized by a maximum hydrocarbon production value (Qi), an annualized initial decline rate (D), and a decline rate over time (b). Qi may represent a maximum periodic hydrocarbon production value for a particular well over a lifetime of production for the well. D and b may define the producing reservoir (e.g., geologic formation) decline, which are representative of the reservoir's producibility over time. Qi may be more of a function of the local geologic variation and any operational variations. Thus, for an area in which wells associated with that area produce from the same, or at least a homogeneous, reservoir (e.g., sandstone, shale), it may be assumed that D and b are consistent from well to well, while Qi may differ from well to well. Further, the decline curve model may be more complex to include multiple segments (e.g., terminal decline model, usually exponential or constant decline, to account for changes in flow regime such as transient to boundary-dominant flow).

FIG. 1 illustrates an example distributed network architecture 100 that includes one or more client devices and one or more server devices that execute an allocation model through an allocation model service. The network architecture 100 includes a number of client devices 102, 104, 106, 108, 110 communicably connected to a server system 112 by a network 114. The server system 112 includes a processing device 116 and a data store 118. The processing device 116 executes computer instructions (e.g., all or a part of an allocation model) stored in the data store 118 to perform the functions of the allocation model service. For example, in some aspects, the allocation model service may be a subscription service available to the client devices 102, 104, 106, 108, and 110 (and other client devices) by an owner or operator of the server system 112. In some aspects, the server system 112 may be owned or operated by a third party (e.g., a collocation server system) that hosts the allocation model service for the owner or operator of the allocation model service.

Users of the client devices 102, 104, 106, 108, 110 access the server device 112 to participate in the allocation model service. For example, the client devices 102, 104, 106, 108, 110 can execute web browser applications that can be used to access the allocation model service. In another example, the client devices 102, 104, 106, 108, 110 can execute software applications that are specific to the allocation model service (e.g., as "apps" running on smartphones). In other words, all of the allocation model service may be hosted and executed on the server system 112. Or in alternative aspects, a portion of the allocation model service may execute on the client devices 102, 104, 106, 108, and 110 (e.g., to receive and transmit information entered by a user of such client devices and/or to display output data from the allocation model service to the user).

In some implementations, the client devices 102, 104, 106, 108, 110 can be provided as computing devices such as laptop or desktop computers, smartphones, personal digital assistants, portable media players, tablet computers, or other appropriate computing devices that can be used to communicate with an electronic social network. In some implementations, the server system 112 can be a single computing device such as a computer server. In some implementations, the server system 112 can represent more than one computing device working together to perform the actions of a server computer (e.g., cloud computing). In some implementations, the network 114 can be a public communication network (e.g., the Internet, cellular data network, dialup modems over a telephone network) or a private communications network (e.g., private LAN, leased lines).

As illustrated in FIG. 1, the server system 112 (e.g., the data store 118) may store one or more hydrocarbon production records 120. Each hydrocarbon production record 120 may be publicly available information associated with a particular hydrocarbon production area (e.g., lease or otherwise) and identified by a particular area identification value ("area ID"). In some aspects, an area ID may be a lease name, a county name, or other identifying characteristic for a group of wells.

For example, each record may include reported aggregated hydrocarbon well production for the particular area, the first and last hydrocarbon production periods for each well associated with the particular area, and pending production reported for each well associated with the particular area. In some aspects, each hydrocarbon production record 120 may include well test data (when available) reported for one or more of the wells associated with the particular area.

In some aspects, the hydrocarbon production records 120 may also include output data from the allocation model that are based on, for example, the reported aggregated hydrocarbon well production for the particular area, the first and last hydrocarbon production periods for each well associated with the particular area, and pending production reported for each well associated with the particular area. Such output data may be presented, for example by the server system 112, for viewing or otherwise by the client devices 102, 104, 106, 108, and 110.

In some aspects, data in the hydrocarbon production records 120 may be arranged as arrays of time values for each period in the hydrocarbon production values associated with the record 120 (e.g., associated with an area ID). In some aspects, each array comprises a doubly-sub scripted array of currently allocated production streams where the first index is the well (e.g., well name or well identification (ID) value) and the second index is the period (e.g. month). In cases where a well has no production in a given period (e.g., has not yet started production, has ended production, or been temporarily shut-in or suspended), then the stream value for that well in that month is flagged as non-producing. The hydrocarbon production record 120 may also include doubly-subscripted array of pending production where the first index is the well (e.g., well name or well identification (ID) value) and the second index is the period (e.g. month). Pending production may also contain a zero-value in any period where the well was off-line for the duration of the period (e.g., was shut in or production was suspended). If a well has no pending production in a given period, then the pending production value for that well in that period is flagged as producing, but without a known value. The hydrocarbon production record 120 may also include doubly-subscripted array of well test data (e.g., scaled to periodic, such as monthly, values) where the first index is the well (e.g., well name or well identification (ID) value) and the second index is the period (e.g. month). If a well has no well test data in a given period, then the well test value for that well in that period may also be flagged producing, but without a known value.

FIGS. 2A-2C, 3A-3B, and 4 illustrate flowcharts that depict an example iterative process for allocating hydrocarbon production values on a well-by-well basis for a selected area with an allocation model 200. In some aspects, the allocation model 200 may be executed by the server system 112 (e.g., the processing device 116). In some aspects, the allocation model 200 may include one or more sub-processes, such as processes 300 and 400 illustrated in FIGS. 3A-3B and 4, respectively.

The illustrated implementation of the allocation model 200 may begin at step 202, which includes receiving a selection of a particular area ID, e.g., from a client device. For example, the allocation model service may expose (e.g., in a drop down menu or otherwise) the area IDs associated with the hydrocarbon production records 120 to the client devices 102 . . . 110 for selection. A user of a particular client device may select a particular area ID, with the selection received or acknowledged by the allocation model service on the server system 112.

Figure 5A:
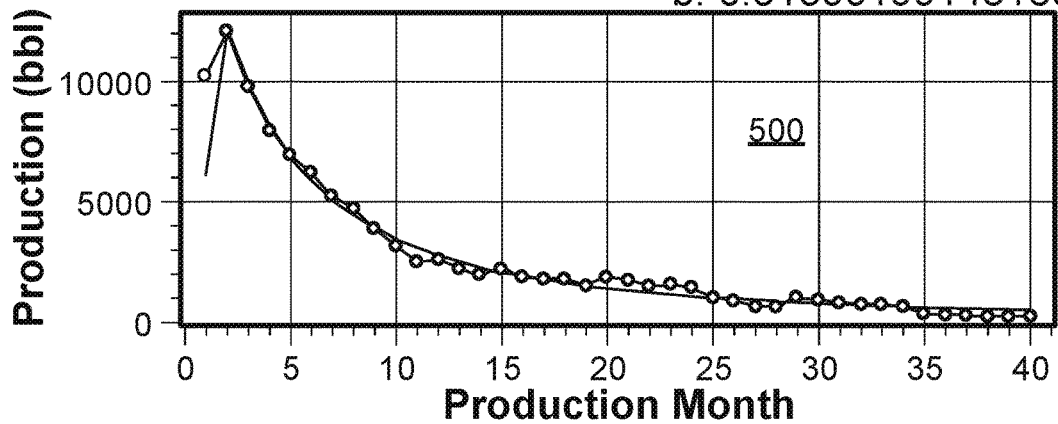
FIGS. 5A-5F graphically illustrate one or more steps of the example iterative process for allocating hydrocarbon production values on a well-by-well basis for a selected area according to the present disclosure.
Figure 5A:
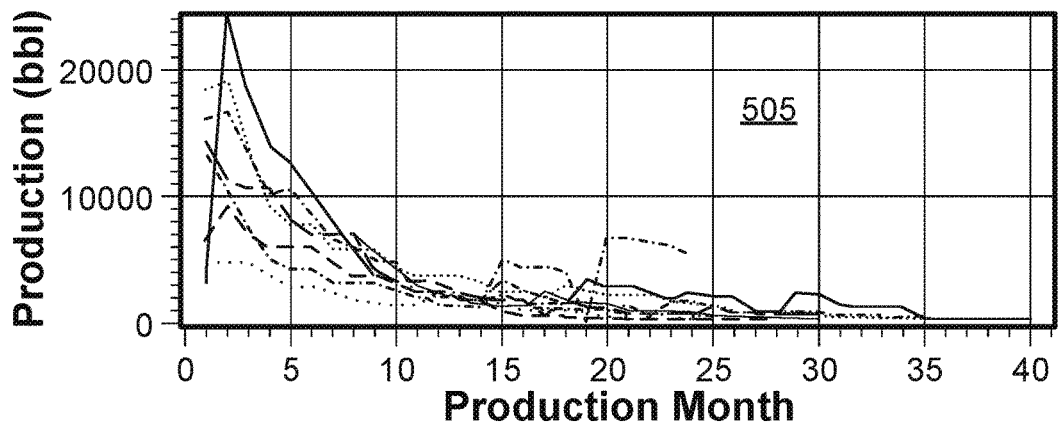
Figure 5A:
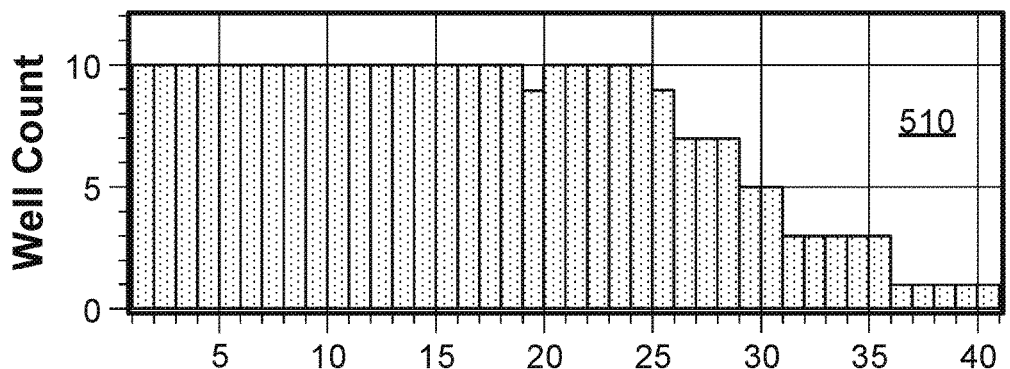

The allocation model 200 may continue at steps 204 through 208, which include identifying periodic hydrocarbon production values associated with the selected area ID, identifying first and last periods of hydrocarbon production values associated with the selected area ID, and identifying wells associated with the selected area ID, respectively. For example, the allocation model service may identify or otherwise determine the particular hydrocarbon production record 120 that is associated with the selected area ID. Turning briefly to FIG. 5A, a graphical representation of the area-level (e.g., lease level) periodic hydrocarbon production value curve 500 associated with the selected area ID is illustrated. As shown, the curve 500 connects each period's (each month's, represented on the x-axis) aggregate lease-level production (represented in barrels (BBL) on the y-axis) from a first period (November 2012) to a last period (March 2016). In this example, the area ID is associated with the Prost Unit B lease in McMullen County, Tex., USA. The data shown in FIG. 5A is generated from publicly available reported production data (as reported to the Railroad Commission of the State of Texas).

Data stored in or associated with the particular hydrocarbon production record 120 may, therefore, also be identified or otherwise determined. Such data, as previously described, may include reported aggregated hydrocarbon well production for the selected area ID, the first and last hydrocarbon production periods for each well associated with the selected area ID, and pending production reported for each well associated with the selected area ID.

The allocation model 200 may continue at step 210, which includes allocating the periodic hydrocarbon production values among the identified wells on a periodic basis. For example, while the hydrocarbon production record 120 (e.g., based on or including reported, publicly-available production information) may include hydrocarbon production values for the selected area ID (e.g., for the selected lease), such reported values may only be at an area-level (e.g., lease-level) rather than for individual wells associated with the selected area. Thus, the allocation model 200 may determine allocated well-by-well periodic production values.

Figure 2A:
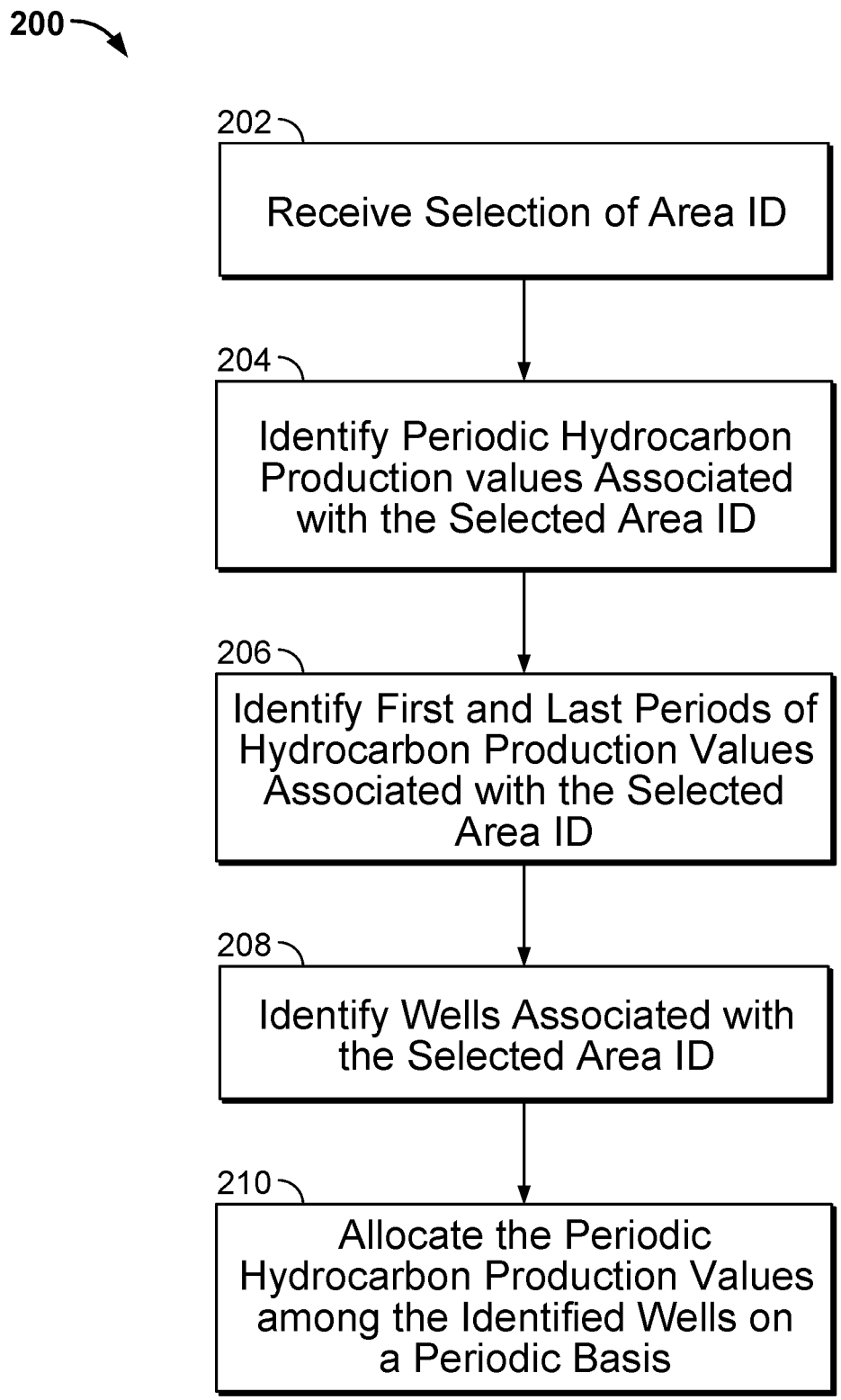
FIGS. 2A-2C, 3A-3B, and 4 illustrate flowcharts that depict an example iterative process for allocating hydrocarbon production values on a well-by-well basis for a selected area according to the present disclosure.
Figure 2B:
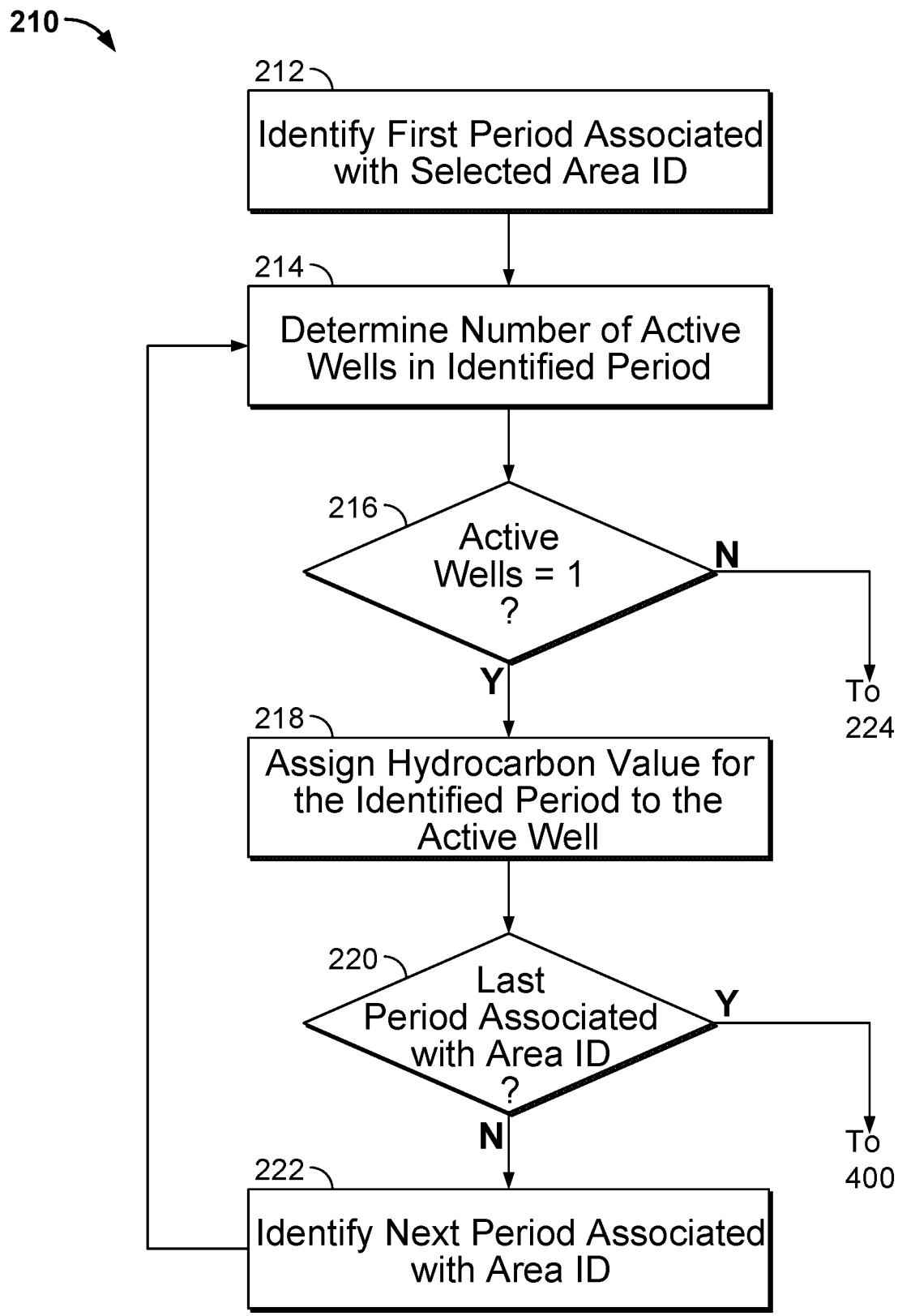

FIG. 2B illustrates a particular implementation of step 210 as shown in steps 212-through 222. Steps 212-222 of the allocation model 200 may be executed, therefore, in order to execute step 210 of the model 200. Step 212 includes identifying a first period associated with selected area ID. For example, in some aspects, the first period may include a first month in which the area ID included hydrocarbon production for at least one well associated with the area ID.

The allocation model 200 continues at step 214, which includes determining a number of active wells in the identified period. An active well, for example, includes a well associated with the area ID that is also associated with the identified period within the hydrocarbon production record 120. For instance, typically, an active well is a well which includes hydrocarbon production included in the hydrocarbon production value associated with the selected area ID for the identified period. Not all wells associated with the selected area ID may be active for each period (e.g., from first to last period), as not every well may produce hydrocarbon in every period and/or not every well may go "online" (e.g., produce hydrocarbons) in the same period (e.g., wells go online in "staggered" periods).

In step 216, a determination is made whether there is one active well in the identified period or more than one active well in the identified period. If there is a single active well associated with the area ID in the identified period, then, in step 218, the hydrocarbon value for the identified period is assigned (e.g., allocated) to the single active well. In other words, in the case of only one active well reported during a particular period (e.g., month), then all reported hydrocarbon production for the identified period is assigned or allocated to that well.

In step 220, a determination is made whether the identified period is the last period (e.g., month) associated with the area ID. In some aspects, for example, an area ID may have many periods of production, such as years or decades. If the identified period is the last period associated with the area ID, then the allocation model 200 continues in an iterative process through sub-process 400 (explained in more detail below). Otherwise, the next period associated with the area ID (e.g., the next month) is identified in step 222 and the model 200 returns to step 214 to loop through steps 216-222.

As is often the case, there may be more than one active well reported for the selected area ID for the identified period. Thus, if there are more than one active well, step 216 continues at step 224, shown in FIG. 2C. Generally, and as explained in more detail below, when more than one active well is contained in an area-level aggregate hydrocarbon production value for the identified period, the allocation is based on either a predicted production value from the decline curve for each well, or for proportional allocation to the well if no decline curve yet exists for the well, or some combination of these two. In some aspects, a decline curve may be assigned to a well once the periodic production declines from the identified period to the next subsequent period for the well. For instance, based on such a decline, a maximum production value (e.g., Qi) has been determined for that particular active well.

Figure 2C:
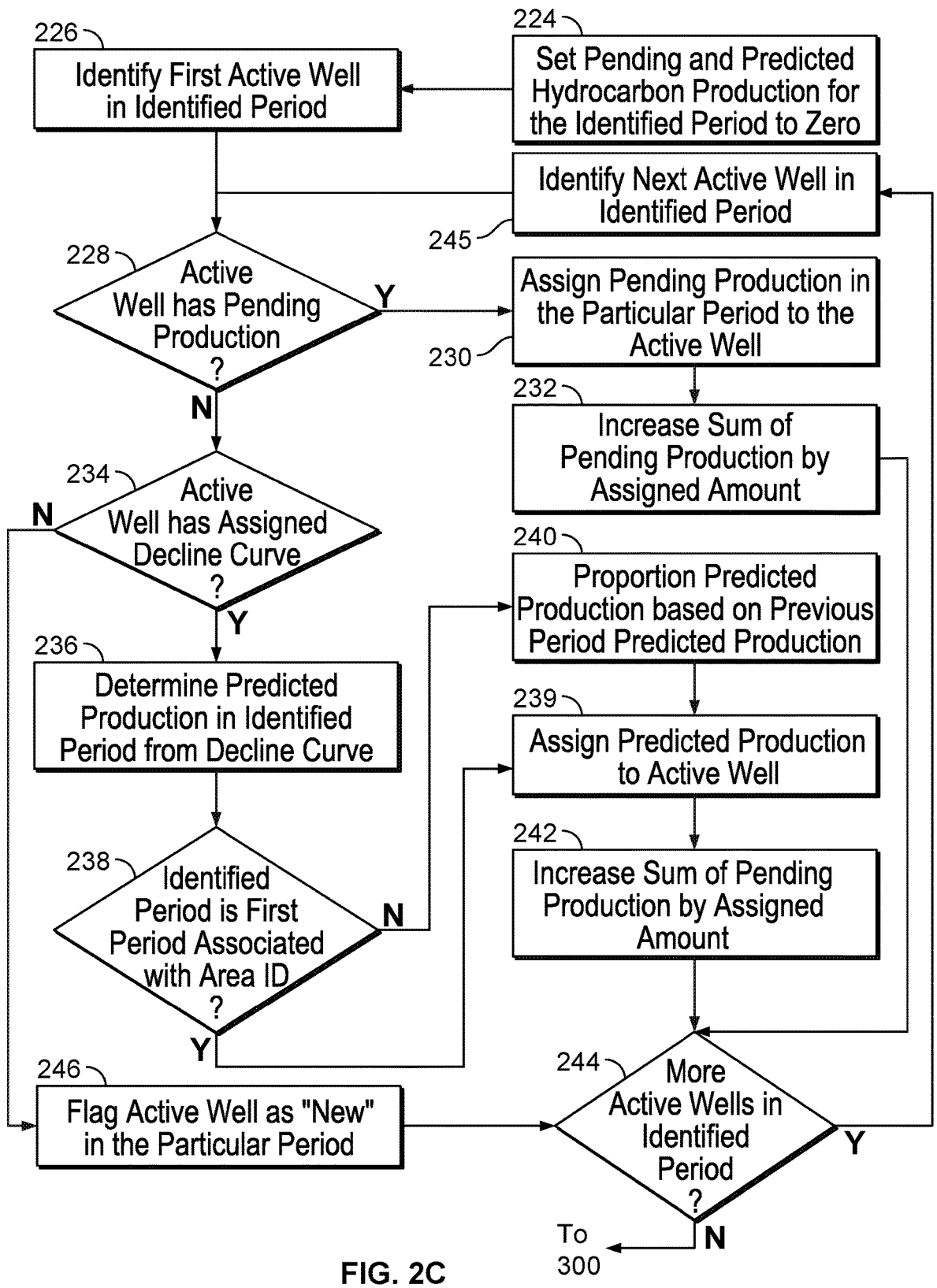

The illustrated implementation of the allocation model 200 continues at step 224 as shown in FIG. 2C. In some aspects, steps 226-244 generally describe a sub-process within the allocation model 200 that: (i) determines allocated production values for active wells in the identified period; and (ii) flags or determines "new" wells in the identified period (e.g., wells associated with the area ID that first produced hydrocarbon values in the identified period. Step 224 includes setting pending and predicted hydrocarbon production for the identified period to zero. For instance, the allocation model 200 may record or otherwise keep track of pending production (e.g., as reported and included in the hydrocarbon production record 120) for an identified period, as well as predicted production (e.g., periodic production for a particular well based on a decline curve assigned to the well). By setting these values to zero, initially, and subsequently updating such values (as described below), the allocation model 200 may ensure that a sum of allocated production for the one or more active wells in a particular period does not exceed the reported aggregated hydrocarbon production value for that particular period.

Figure 5B:
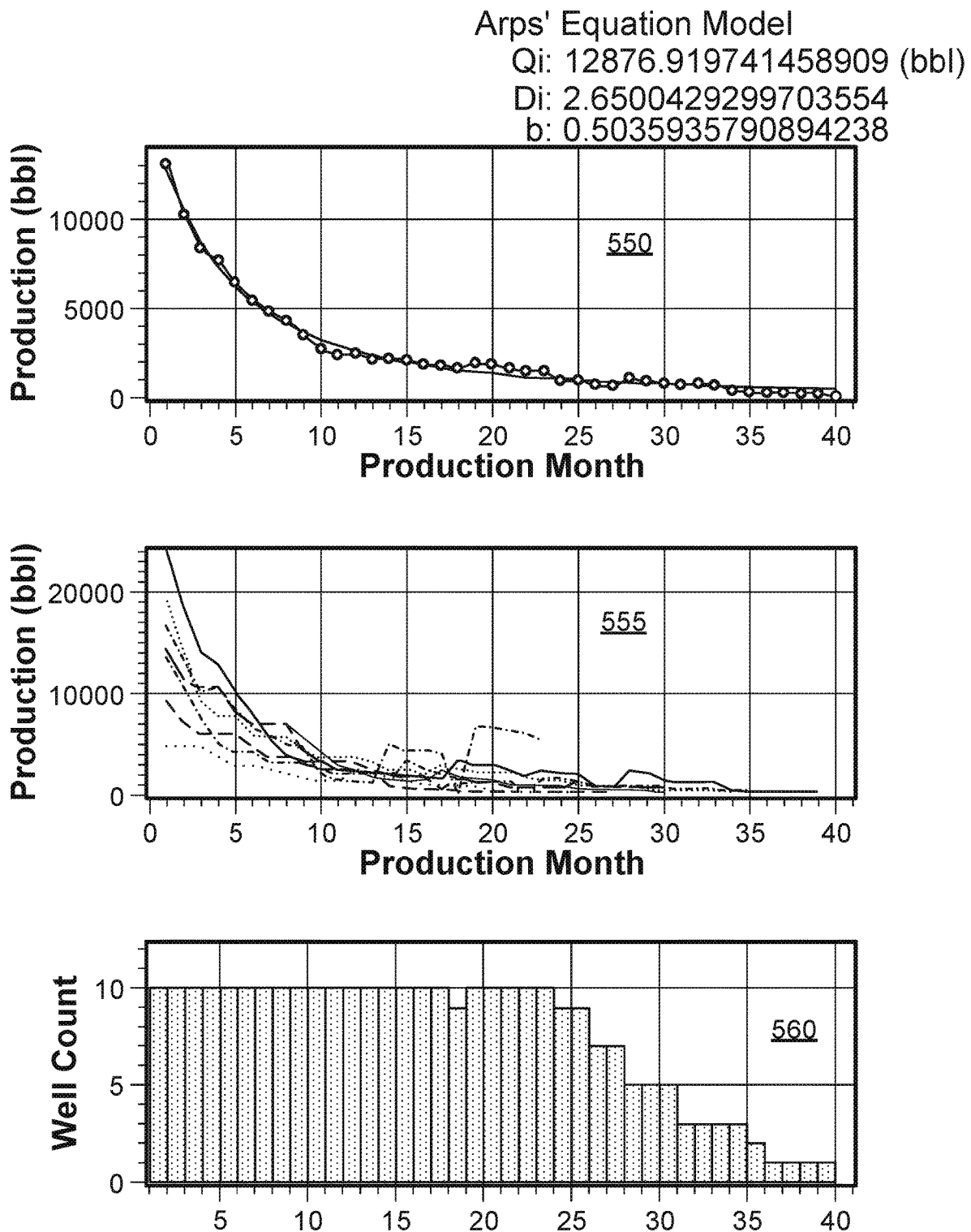
Figure 5C:
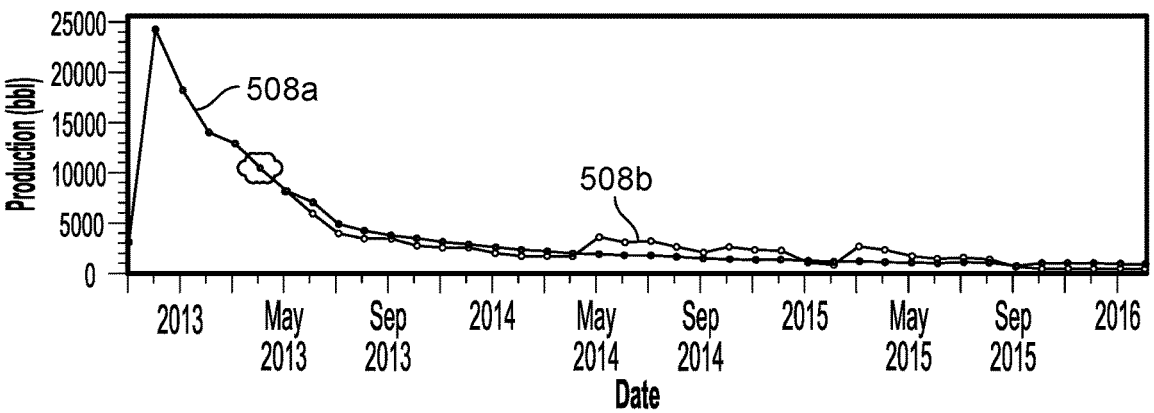
Figure 5C:
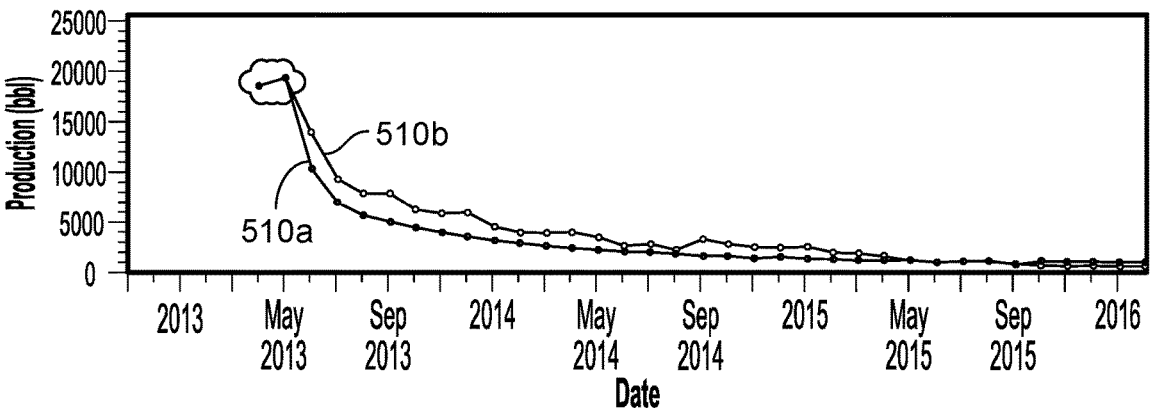
Figure 5C:
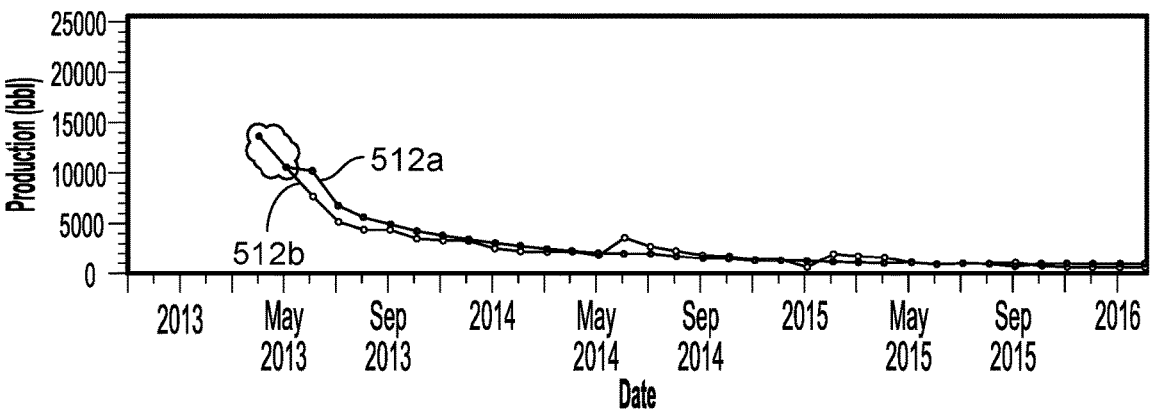

The allocation model 200 continues at step 226, which includes identifying a first active well (among two or more active wells) in identified period. If the identified active well has pending production for the identified period (e.g., as recorded in the hydrocarbon production record 120 for the selected area ID), then the pending production is assigned (e.g., allocated) to the identified active well in step 230. Once the pending production is assigned (e.g., allocated) to the identified active well in step 230, the allocation model 200 increases a sum of pending production (initially set to zero in step 224) by the amount of assigned pending production in step 232. Turning briefly to FIG. 5C, graphical illustrations for three wells on the Prost Unit B lease (wells 1H, 2H, and 3H) are illustrated (with the curves 508a, 510a, and 512a for wells 1H, 2H, and 3H, respectively) once step 232 of the allocation model 200 has been completed for this example area (e.g., lease) and wells on the lease for all periods associated with the lease. Here, pending production assigned to each of the wells 1H, 2H, and 3H, are highlighted with bubble callouts. The 2H well does not reach its maximum production in its first month but in the second month. The decline curve for the 3H can be defined in its second month of production, but the 2H is defined in its third month. Had there been new wells beginning production in these months, then the amount assigned to them would have been proportionally allocated from the difference of the lease-level value and the sum of the pending production values plus the sum of any adjusted predicted values (as described with reference to FIG. 3A). In comparison, curves 508b, 510b, and 512b for wells 1H, 2H, and 3H, respectively, show an allocation determined by conventional techniques.

Step 232 continues to step 244, in which the allocation model 200 determines whether there is an additional active well in the identified period. If so, then the sub-process shown in FIG. 2C identifies the next active well in the identified period in step 245 and loops back to step 228 to determine an allocated production for the next identified active well.

If the identified active well has no pending production for the identified period (e.g., as recorded in the hydrocarbon production record 120 for the selected area ID) in step 228, then the allocation model 200 continues to step 234 and determines whether the identified active well has an assigned decline curve. If the identified active well has an assigned decline curve, then a predicted production in the identified period for the identified active well is determined in step 236. For example, the assigned decline curve may predict what the production of the identified active well would be, absent a reported pending production value for that well in that period.

In step 238, the allocation model 200 determines whether the identified period is the first period associated with the area ID (e.g., as recorded in the hydrocarbon production record 120 of the area ID). If the identified period is not the first period, then the predicted production (e.g., from the decline curve) is proportioned according to a predicted production for the identified active well in a previous period (e.g., the immediately previous period to the identified period) in step 240. The proportioned predicted production value is then assigned to the identified active well in step 239.

Figure 5D:
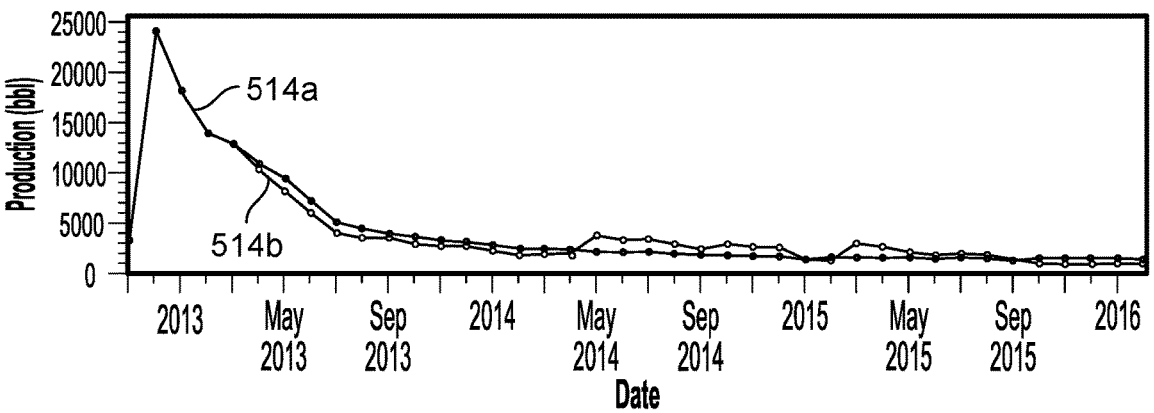
Figure 5D:
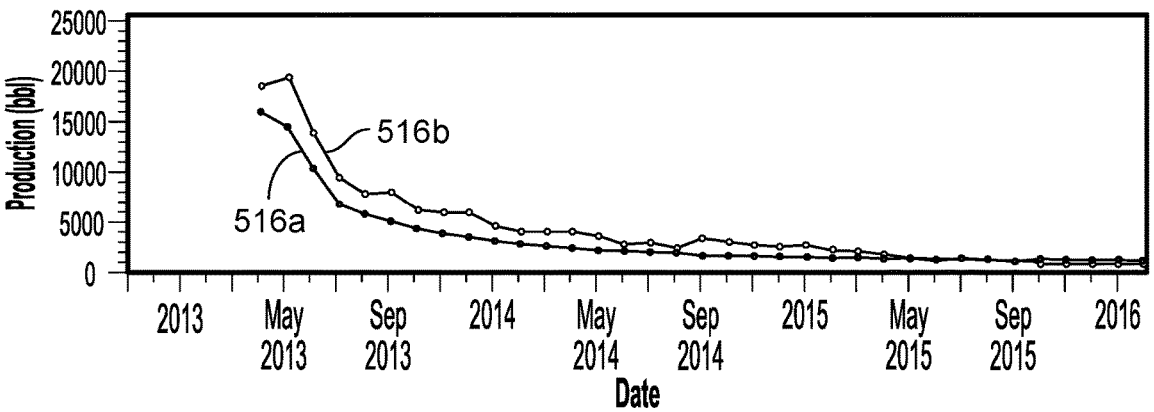
Figure 5D:
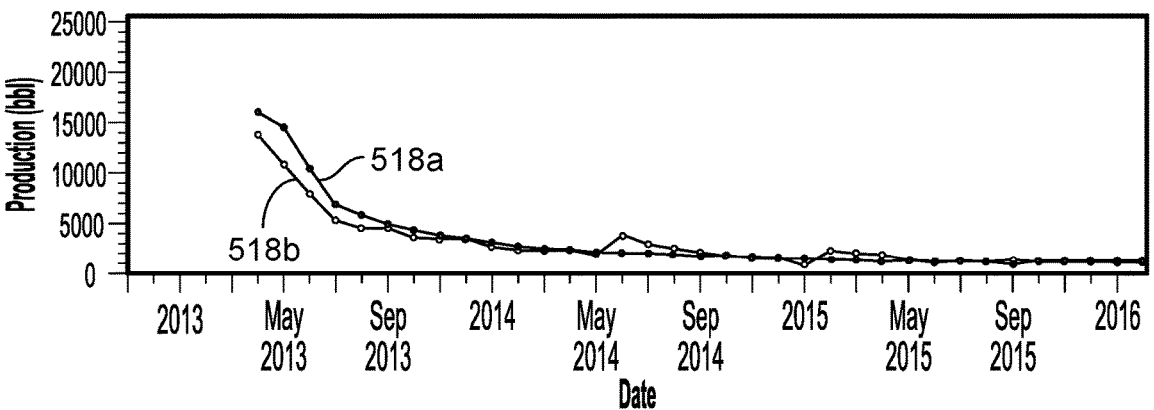

Turning briefly to FIG. 5D, graphical illustrations for three wells on the Prost Unit B lease (wells 1H, 2H, and 3H) are illustrated (with the curves 514a, 516a, and 518a for wells 1H, 2H, and 3H, respectively) once step 240 of the allocation model 200 has been completed for this example area (e.g., lease) and wells on the lease for all periods associated with the lease. As shown the 1H well was the only well producing for the first five months, so it has been assigned the entire lease production during that period. The 2H and 3H wells began production in the same month (April 2013). Based upon the decline curve for the 1H well ($Q_i=24,137$ bbls), its adjusted predicted value is 10,780 bbls. This is subtracted from the lease-level value of 42,258 bbls so that the 2H and 3H are equally assigned half the difference (15,738 bbls). In the next month, using a similar allocation, the 2H and 3H each receive 14,269 bbls (37,749 bbls less 9,211 bbls for the 1H divided by 2). Because the production value has decreased for both the 2H and the 3H wells, a decline curve for them may be defined with $Q_i=15,738$ bbls. In addition to honoring the lease-level monthly values (e.g., the sum of all allocated values must equal the lease-level values), it may be that there are pending production values for certain wells that are also honored by the allocation model 200. This is the case for all three of these wells. The 1H well has six months of pending production (one more month than being the only well in the lease), and the 2H and 3H wells each have two months of pending production. These pending values are thus included in the allocated production streams shown in these figures. In comparison, curves 514b, 516b, and 518b for wells 1H, 2H, and 3H, respectively, show an allocation determined by conventional techniques.

If the identified period is the first period as determined in step 238, or once the proportioned predicted production value is then assigned to the identified active well in step 239, the allocation model 200 continues in step 242, which includes increasing a sum of pending production (initially set to zero in step 224) by the assigned amount from step 239. Again, by updating the sub of a pending production value and a sum of a predicted production value in the identified period, the allocation model may ensure that a sum of allocated production for the one or more active wells in a particular period does not exceed the reported aggregated hydrocarbon production value for that particular period.

Step 242 also continues at step 244, in which the allocation model 200 determines whether there is an additional active well in the identified period. If so, then the sub-process shown in FIG. 2C identifies the next active well in the identified period in step 245 and loops back to step 228 to determine an allocated production for the next identified active well.

Returning to step 234, if the identified active well does not have an assigned decline curve (and also does not have any pending production for the identified period as determined in step 228) then the identified active well is flagged as a "new" well in the identified period in step 246. Step 246 also continues to step 244, in which the allocation model 200 determines whether there is an additional active well in the identified period. If so, then the sub-process shown in FIG. 2C identifies the next active well in the identified period in step 245 and loops back to step 228 to determine an allocated production for the next identified active well.

Figure 3A:
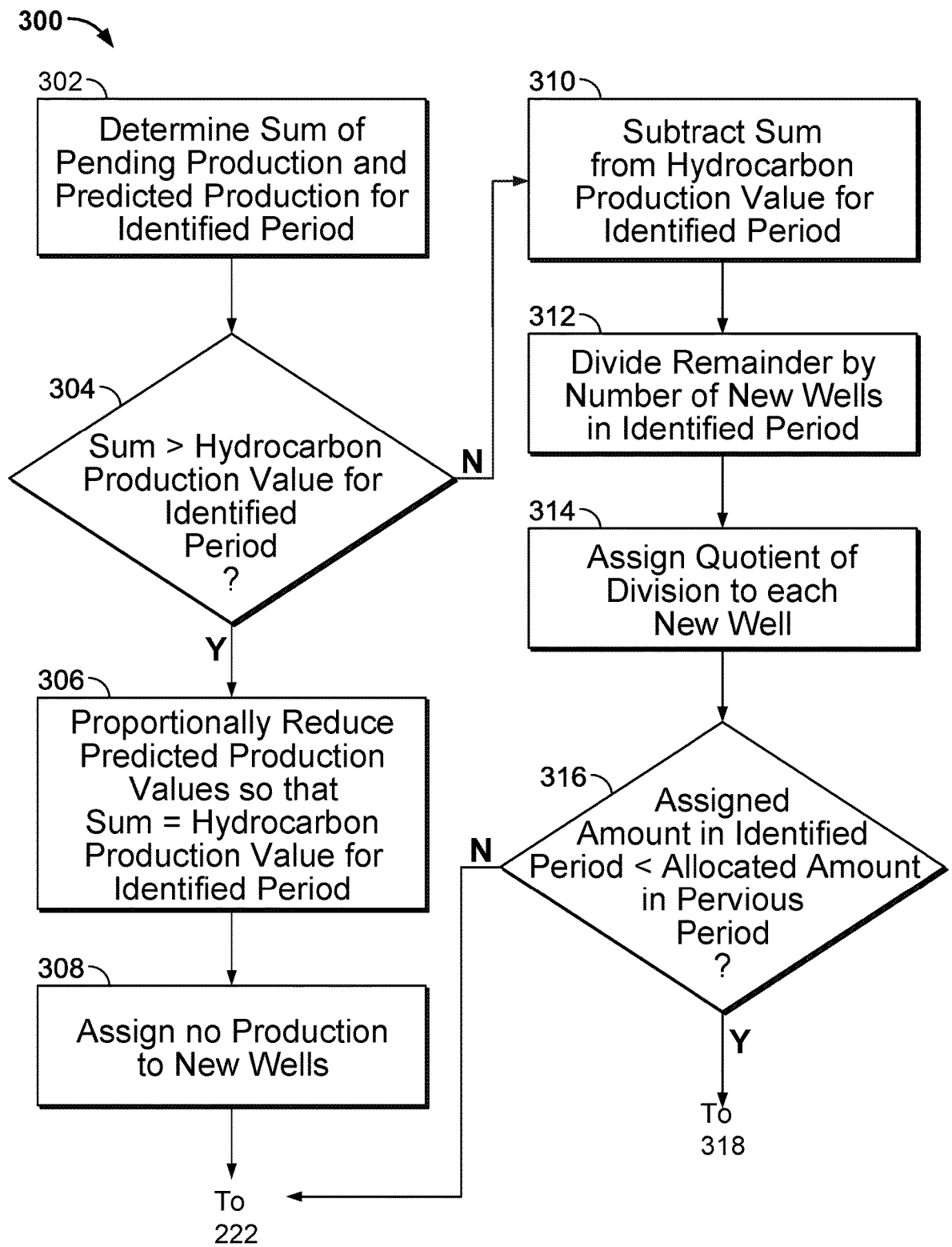
Figure 3B:
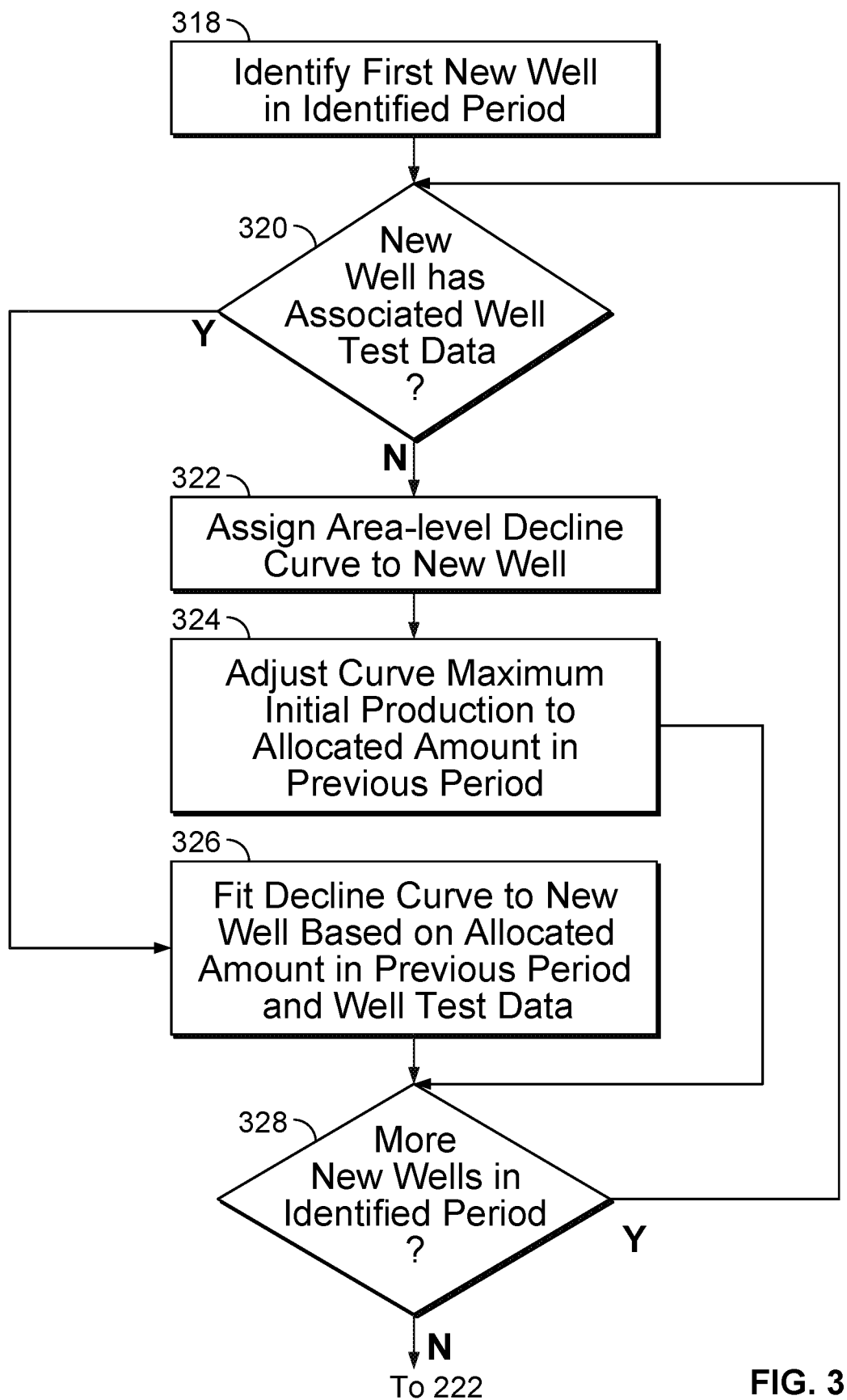

If the allocation model 200 determines that there are no additional active wells in the identified period in step 244, then the allocation model 200 continues to sub-process 300 shown in FIG. 3A. Generally, the sub-process 300 of the allocation model 200: (i) determines allocated production values for "new" wells in the identified period (as shown in FIG. 3A), and (ii) applies any well test data to "new" wells (as shown in FIG. 3B).

The illustrated implementation of the allocation model 200 continues at step 302, which includes determining a sum of pending production and predicted production for the identified period. As described above, the pending production value and predicted production values are initially set to zero (in step 224) and updated (in steps 232 and 242) to account for assigned values to identified active wells.

If, in step 304, the allocation model 200 determines that the sum is less than or equal to the aggregated hydrocarbon production value (e.g., from hydrocarbon production record 120) for the identified period, then the sum is then subtracted from the aggregated hydrocarbon production value for the identified period in step 310. The difference (e.g., the remainder) is then divided by the number of flagged new wells in the identified period in step 312. The quotient of the division of step 312 is then assigned to each flagged new well in the identified period in step 314.

Step 314 continues to step 316, where the allocation model 200 determines whether the assigned amount (from step 314) in the identified period is less than an amount allocated to the new well in a previous period (e.g., an immediately previous period to the identified period). If the determination is "yes," then the sub-process 300 continues at step 318 (described in more detail below). If the determination in step 316 is "no," then the sub-process 300 returns to step 222 (e.g., to identify the next period associated with the area ID).

Returning to step 304, if the allocation model 200 determines that the sum is greater than the aggregated hydrocarbon production value (e.g., from hydrocarbon production record 120) for the identified period, then the predicted production value for each active well in the identified period is proportionally (e.g., equally) reduced so that the sum is equal to the aggregated hydrocarbon production value. Thus, step 306 ensures that the sum of pending and predicted production for active wells in the identified period does not exceed the reported aggregated area-level hydrocarbon production value for the identified period.

Step 306 continues to step 308, which includes assigning no production to new wells. For instance, if the allocation model 200, after allocating pending production to active well(s) in the identified period, determines that the predicted production values for active wells with assigned decline curves accounts for all of (and possibly more than) the difference in the aggregated area-level hydrocarbon production value for the identified period and the allocated pending production, then new wells in the identified period receive no allocated or assigned predicted production. Thus, pending production, in this implementation of the allocation model 200, takes precedence over either proportionally allocated values for wells without a decline curve (yet defined) and over adjusted predicted values for wells with decline curves. Step 308 continues to step 222 (e.g., to identify the next period associated with the area ID).

Figure 5E:
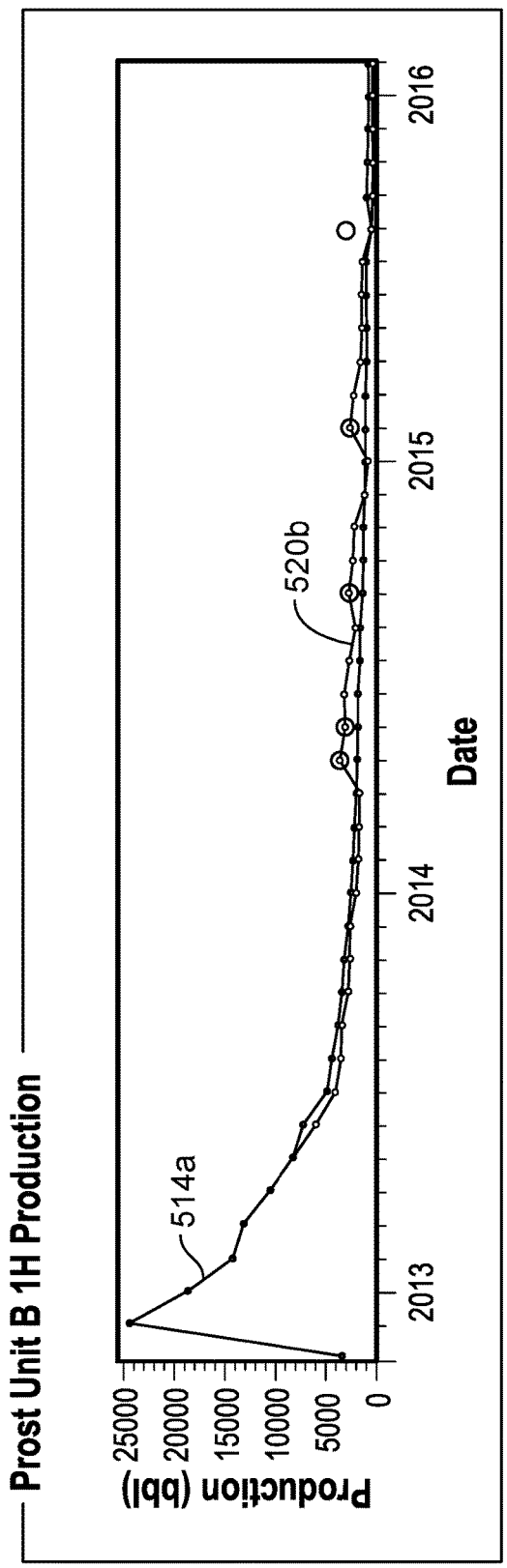

Returning to step 316, if the determination is "yes," then the sub-process 300 continues at step 318, which includes identifying the first new well in the identified period. A determination is made at step 320 as to whether the identified new well has associated well test data (e.g., from the hydrocarbon production record 120 for the selected area ID). Turning briefly to FIG. 5E, the curve 514a for the 1H well is shown along with a curve 520b which represents a conventional allocation technique used for this well that strictly adheres to well test data, shown with the larger dots on the curve. Note that the well-test values on curve 520b are consistently (but not necessarily) larger than the allocated values for the months with well-test data on curve 514a.

If the new well has no associated well test data (e.g., a 24 hour well test scaled to one month of production) in step 320, then the allocation model 200 continues at step 322, which includes assigning the area-level decline curve to the identified new well. For example, once a decline curve is assigned (e.g., based on reservoir geology or a previous determination of allocated periodic production values for the wells associated with the area ID (e.g., from a previous iteration of the allocation model 200). For instance, in some aspects, the hydrocarbon production record 120 includes a decline curve model, for example, based on known reservoir information (e.g., geologic information of a known rock formation). Turning briefly to FIGS. 5A and 5B, the graphs 500 and 550, respectively, show area-level decline curves are shown for the ten wells on the Prost Unit B Lease.

Step 322 continues to step 324, which includes adjusting the assigned curve maximum initial production (Qi) for the identified new well to the allocated amount in the previous period (as described in step 316).

Figure 5F:
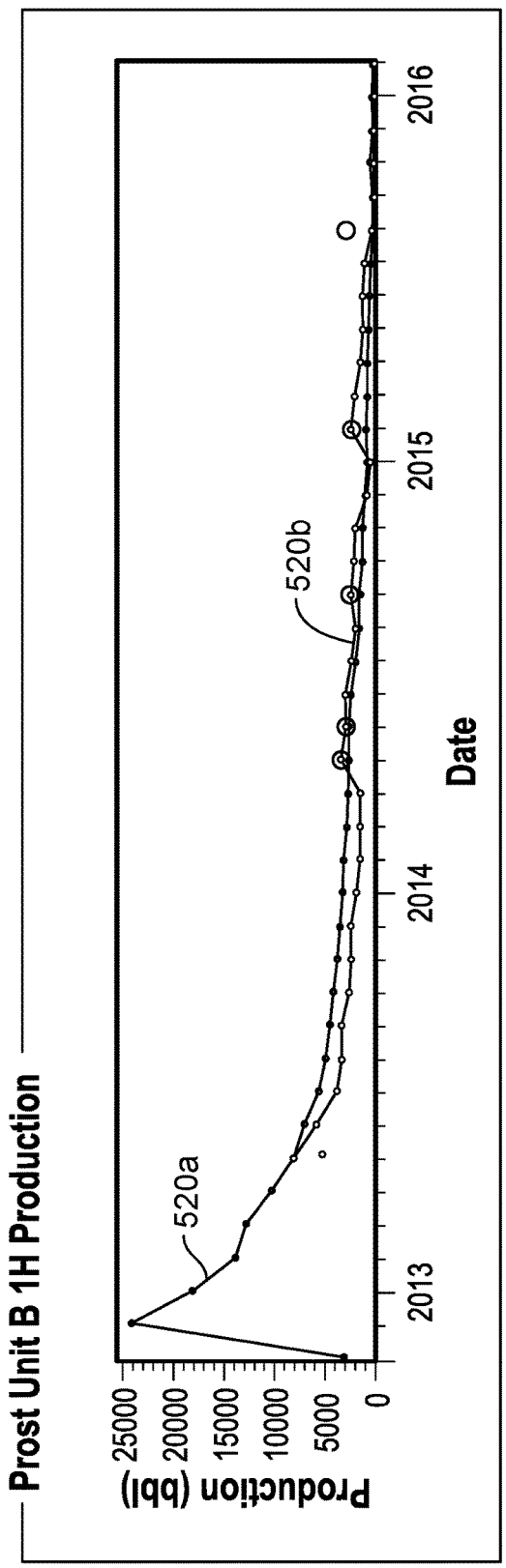

If the new well has associated well test data (e.g., a 24 hour well test scaled to one month of production) in step 320, then the allocation model 200 continues at step 326, which includes fitting a decline curve to the identified new well based on allocated amount in previous periods and the associated well test data. Turning briefly to FIG. 5F, a new curve 520a for the 1H well is shown that takes into account well test data for this well. Note that the curve 520a does not exactly fit the well-test values, but the overall curve 520a has been "raised" in accordance with the well test data. The production stream for the 1H well now has been allocated honoring pending production and conditioned with the well-test data. The aggregated lease-level production values (e.g., from the reported production) are also honored in curve 520a.

Steps 324 and 326 continue to step 328, and a determination is made whether there are any additional new wells in the identified period. If the determination is "yes," then step 328 loops back to step 320. If the determination is "no," then the allocation model 200 returns to step 222 (e.g., to identify the next period associated with the area ID).

Figure 4:
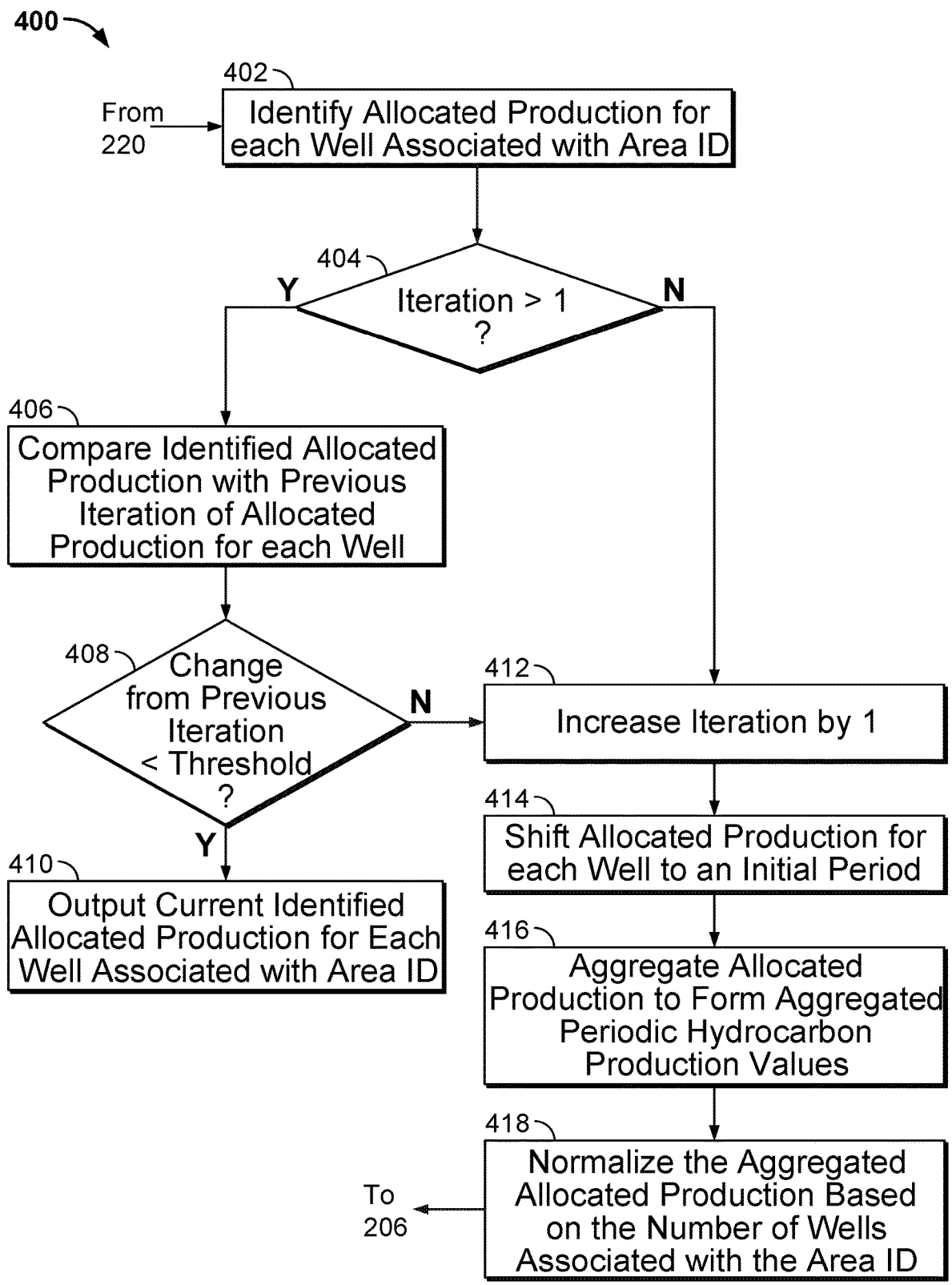

Returning to step 220, if the identified period is the last period associated with the area ID, then the allocation model 200 continues in an iterative process through sub-process 400, shown in FIG. 4. For example, in some aspects, the allocation model 200 is iteratively executed to a desired or specified convergence. For example, with each iteration, a particular metric may be determined and compared against a specified or desired threshold of that metric. The metric may be, for example, an absolute average change in periodic production averaged over all producing periods for all wells. As another example, the metric may be a sum of squared changes in periodic production averaged over all producing periods for all wells. If the metric is greater than the threshold, the iterative process may continue (e.g., allocation model 200 may be iteratively executed). In some aspects, even if the threshold is not met, the iterative process may be limited to a maximum number of iterations (e.g., by the user or operator of the allocation model service). If the metric is less than the threshold, the iterative process may terminate and retain the determined, well-by-well periodic allocated production values produced in the previous iteration. Such retained values may be transmitted to or displayed at the client devices 102, 104, 106, 108, and/or 110 from the server system 112.

Figure 6:
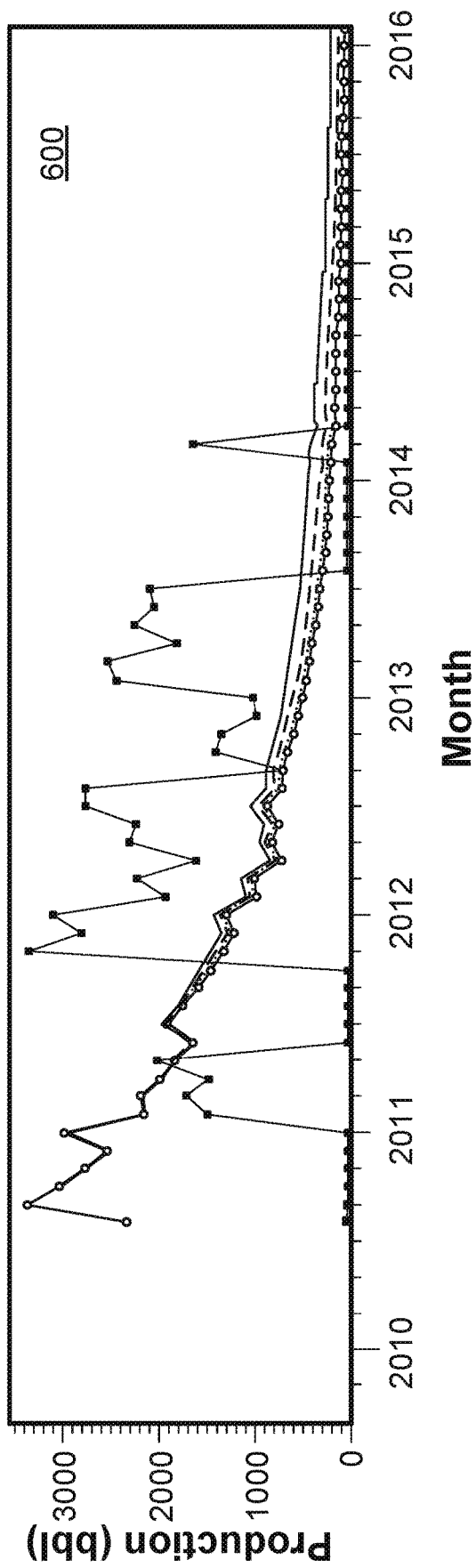
FIG. 6 illustrates an example output from an iterative process for allocating hydrocarbon production values on a well-by-well basis for a selected area according to the present disclosure.
Figure 6:
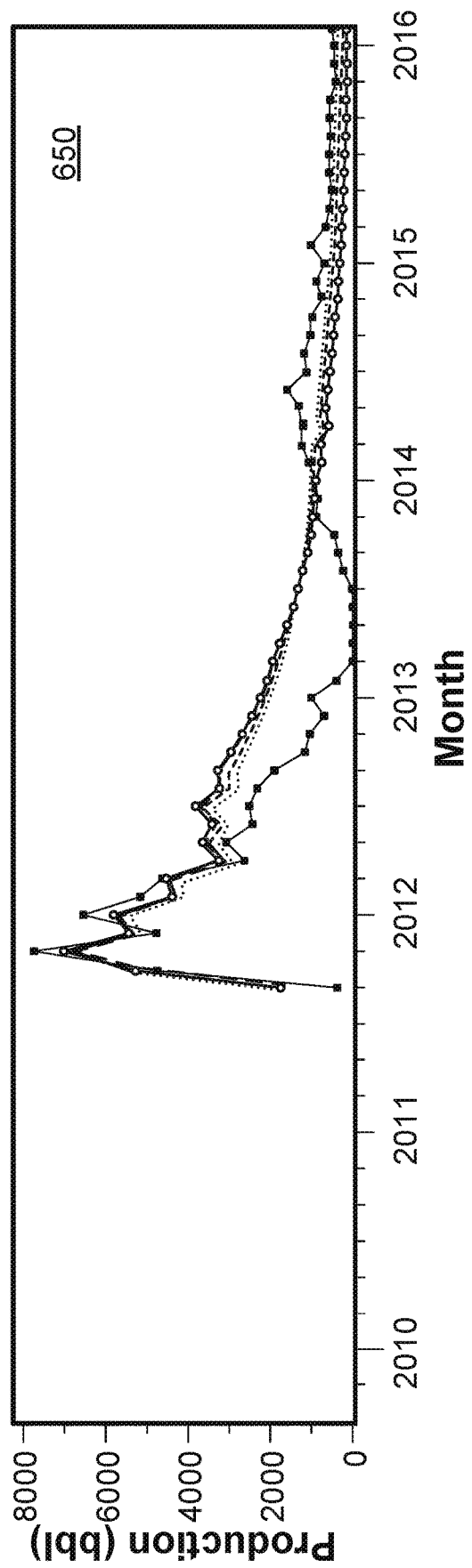

Step 220 thus continues to step 402, which includes identifying allocated production for each well associated with the area ID. As an example of what the identified allocated production values appear, graphically, turning to FIG. 6, this figure shows plots 600 and 650 that represent allocated production streams (e.g., first iteration, last iteration, and one or more intermediate iterations) for two wells (6H and 32H) out of 126 wells in the Briscoe Ranch Cochina East Ranch lease in Dimmit County, Tex. The initial allocated streams (graph 600 for the 6H well and graph 650 for the 32H well) are shown with plots with circular points and the final allocated streams with plots with square points. The smooth plots represent the allocated streams in intermediate iterations between the first and last iteration (e.g., as shown, a total of six iterations to convergence).

If the allocation model 200 has executed only once, then the number of iterations is increased by 1 in step 412. In step 414, the identified allocation production values are shifted for each well to a common initial period. For example, all the allocated production streams (determined from the first iteration of the allocation model 200) are time-shifting to month "0." Turning briefly to FIG. 5A, these shifted allocated values are shown graphically. By doing so, the allocated production streams, on a well-by-well basis, appear to all begin production at the same initial period (e.g., the same month) even though they may not have, in reality, began production in the same period.

The initial period may also be defined as period in which maximum or "peak" production occurs. Using this period as an initial period instead of period "0" (e.g., month 0) may provide better results for the decline curve fitting. For example, turning briefly to FIGS. 5A-5B, these figures show a difference between shifting the allocated values to a period "0" (e.g., month "0" of the area ID) and shifting the allocated values to an initial period which represents the maximum production value (Qi) for each well in the area ID. FIG. 5A shows an example curve 505 in which the allocated values are shifted to a common period "0" (e.g., a first period in which production was reported for an area ID). FIG. 5A shows the generation of the Prost Unit B type curve from the ten producing wells on this lease. The curve 505 is the result of each individual well stream being referenced to the first month of production for this lease and then the monthly values averaged by the number of producing wells in each month (shown in the histogram 510). As shown in this example, the deterministic decline curve (in this example, an Arp's equation decline curve), has parameters of Qi, Di, and b for the curve 500 as shown.

FIG. 5B shows the generation of the Prost Unit B type curve from the ten producing wells on this lease when each individual well stream is referenced to an initial period "0" which represents the period for each respective well in which the maximum production (Qi) for that respective well was reported. In this figure, the curve 555 is the result of each individual well stream being referenced to the peak month of its respective production for this lease, and then the monthly values averaged by the number of producing wells in each month (shown in the histogram 560). Note the parameters of the Arp's model fit to the type curve and the differences with the type curve referenced to the first month of production. As shown in this example, the deterministic decline curve (in this example, an Arp's equation decline curve), has parameters of Qi, Di, and b for the curve 550 as shown.

In step 416, the shifted allocated production values are aggregated to form a set of aggregated periodic hydrocarbon production values for the selected area ID. The set of aggregated periodic hydrocarbon production values for the selected area ID from step 416 are then normalized by the number of active wells in each period. For example, the aggregated production value for each period (e.g., shifted period) may be divided by the number of active wells in that period to arrive at a set of normalized production values for the production periods.

This normalized set, in some aspects, may mimic, or serve as a substitute for the reported aggregated hydrocarbon production values in the hydrocarbon production record 120 associated with the area ID. This set may thus serve as a substitute for such reported aggregated hydrocarbon production values in the hydrocarbon production record 120 associated with the area ID in step 204 in a subsequent (e.g., not first) iteration of the allocation model 200. Looking again at FIGS. 5A-5B, these figures show two example techniques for normalizing the aggregated hydrocarbon production values. As noted, FIG. 5A shows an example in graph 505 in which the allocated values are shifted to a common period "0" (e.g., a first period in which production was reported for an area ID). FIG. 5B shows an example in graph 555 where the generation of the Prost Unit B type curve from the ten producing wells on this lease when each individual well stream is referenced to an initial period "0" which represents the period for each respective well in which the maximum production (Qi) for that respective well was reported.

Returning to step 404, if the allocation model 200 has executed more than once, the identified allocated production for each well associated with the area ID from the current iteration is compared against allocated production for each well associated with the area ID from the previous iteration. For example, if the identified values in step 402 are from a third iteration of the allocation model 200, then the values stored (e.g., in the data store 118) from the second iteration are compared. By comparison, for instance, a metric representative of each set of allocated production values may be compared, such as absolute average change in periodic production averaged over all producing periods for all wells, a sum of squared changes in periodic production averaged over all producing periods for all wells, or another specified metric. For example, turning to FIG. 6, this figure shows plots 600 and 650 that represent allocated production streams (e.g., first iteration, last iteration, and one or more intermediate iterations) for two wells (6H and 32H) out of 126 wells in the Briscoe Ranch Cochina East Ranch lease in Dimmit County, Tex. The initial allocated streams (graph 600 for the 6H well and graph 650 for the 32H well) are shown with plots with circular points and the final allocated streams with plots with square points. The smooth plots represent the allocated streams in intermediate iterations between the first and last iteration (e.g., as shown, a total of six iterations to convergence). Note that in this example, the allocation model 200 comes close to the final allocated stream in the first iteration (the second pass through the model 200). Iterations two through six improve on the first iteration, which reduced the absolute error by nearly 95% relative to the initial execution of the model 200.

If, in step 408, a determination is made that the metric does not meet (e.g., greater than) a threshold metric value, then step 408 continues to steps 412-418, as described above. If, however, in step 408, the determination is made that the metric does meet (e.g., less than) the threshold metric value, then the currently identified allocated production values for each well associated with the area ID may be output, e.g., to a client device, in step 410.

A number of implementations have been described. Nevertheless, it will be understood that various modifications may be made without departing from the spirit and scope of the disclosure. For example, various forms of the flows shown above may be used, with steps re-ordered, added, or removed. Accordingly, other implementations are within the scope of the following claims.

Implementations of the present disclosure and all of the functional operations provided herein can be realized in digital electronic circuitry, or in computer software, firmware, or hardware, including the structures disclosed in this specification and their structural equivalents, or in combinations of one or more of them. Implementations of the allocation model and allocation model service can be realized as one or more computer program products, e.g., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this disclose can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, implementations of the invention can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations of the invention can be realized in a computing system that includes a back end component, e.g., as a data server, or that includes a middleware component, e.g., an application server, or that includes a front end component, e.g., a client computer having a graphical user interface or a Web browser through which a user can interact with an implementation of the invention, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this disclosure contains many specifics, these should not be construed as limitations on the scope of the disclosure or of what may be claimed, but rather as descriptions of features specific to particular implementations of the disclosure. Certain features that are described in this disclosure in the context of separate implementations can also be provided in combination in a single implementation. Conversely, various features that are described in the context of a single implementation can also be provided in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the present disclosure have been described. Other implementations are within the scope of the following claims. For example, the actions recited in the claims can be performed in a different order and still achieve desirable results.

What is claimed is:

1. A computer-implemented method for allocating hydrocarbon production, comprising:
   (i) receiving, from a client device communicably coupled to a server that comprises one or more computer hardware processors, a selection of a particular area identification (ID) of a plurality of area IDs stored on the server;
   (ii) determining, with the one or more computer hardware processors, based on the selected particular area ID, a plurality of hydrocarbon production values that comprise periodic area-level hydrocarbon production values associated with the particular area ID and a plurality of wells associated with the particular area ID;
   (iii) determining, with the one or more computer hardware processors, a decline curve computer-generated model for the area-level hydrocarbon production values associated with the particular area ID;
   (iv) modeling, with the one or more computer hardware processors, the aggregated periodic well-level hydrocarbon production values with the determined decline curve computer-generated model;
   (v) determining, with the one or more computer hardware processors, allocated well-level hydrocarbon production values based at least in part on the selected decline curve computer-generated model to display at the client device; and generating, with the one or more computer hardware processors, a user-viewable output file that comprises the determined allocated well-level hydrocarbon data values from step (v).

2. The computer-implemented method of claim 1, wherein determining a decline curve computer-generated model for the area-level hydrocarbon production values associated with the particular area ID comprises:
determining, with the one or more computer hardware processors, the decline curve computer-generated model for the area-level hydrocarbon production values associated with the particular area ID based, at least in part, on a geology of a reservoir associated with the area ID.

3. The computer-implemented method of claim 1, wherein determining a decline curve computer-generated model for the area-level hydrocarbon production values associated with the particular area ID based, at least in part, on a geology of a reservoir associated with the area ID comprises:
(vi) determining, with the one or more computer hardware processors, allocated periodic well-level hydrocarbon production values for each of the plurality of wells associated with the particular area ID;
(vii) shifting, with the one or more computer hardware processors, the allocated periodic well-level hydrocarbon production values for each of the plurality of wells to an initial time period;
(viii) aggregating, with the one or more computer hardware processors, the shifted allocated periodic well-level hydrocarbon production values to generate aggregated periodic area-level hydrocarbon production values; and
(ix) determining, with the one or more computer hardware processors, the decline curve computer-generated model for the area-level hydrocarbon production values associated with the particular area ID based on the aggregated periodic well-level hydrocarbon production values.

4. The computer-implemented method of claim 1, further comprising:
determining, with the one or more computer hardware processors, a number of periods associated with the particular area ID;
determining, with the one or more computer hardware processors, a first period of the number of periods, the first period associated with a first area-level hydrocarbon production value; and
determining, with the one or more computer hardware processors, a last period of the number of periods, the last period associated with a last area-level hydrocarbon production value.

5. The computer-implemented method of claim 4, further comprising:
selecting, with the one or more computer hardware processors, a period of the number of periods, starting with the first period and ending with the last period;
for the selected period, determining, with the one or more computer hardware processors, a total number of wells associated with the particular area ID; and
for the selected period, determining, with the one or more computer hardware processors, a number of active wells associated with the particular area ID.

6. The computer-implemented method of claim 5, further comprising, based on the number of active wells being one active well in the selected period, assigning, with the one or more computer hardware processors, an area-level hydrocarbon production value in the selected period to the one active well.

7. The computer-implemented method of claim 5, further comprising, based on the number of active wells being more than one active well, for each active well in the selected period:
determining, with the one or more computer hardware processors, that the active well has pending production in the selected period; and
based on the active well having pending production in the selected period, assigning, with the one or more computer hardware processors, the pending preproduction to the active well.

8. The computer-implemented method of claim 7, further comprising:
determining, with the one or more computer hardware processors, that the active well has no pending production in the selected period;
based on the active well having no pending production in the selected period, determining, with the one or more computer hardware processors, that the active well has an assigned decline curve computer-generated model; and
based on the active well having the assigned decline curve computer-generated model, determining, with the one or more computer hardware processors, a predicted production for the selected period for the active well.

9. The computer-implemented method of claim 8, further comprising:
based on the selected period being subsequent to the first period, determining, with the one or more computer hardware processors, that the active well is associated with a predicted production from the assigned decline curve computer-generated model from a previous period in the number of periods;
proportioning, with the one or more computer hardware processors, the predicted production of the active well for the selected period based on the predicted production of the active well for the previous period; and
assigning, with the one or more computer hardware processors, the proportioned predicted production to the active well for the selected period.

10. The computer-implemented method of claim 7, further comprising:
determining, with the one or more computer hardware processors, that the active well has no pending production in the selected period and no assigned decline curve computer-generated model; and
based on the determination, flagging, with the one or more computer hardware processors, the active well as a new well for the selected period.

11. The computer-implemented method of claim 10, further comprising, for each new well in the selected period:
determining, with the one or more computer hardware processors, a sum of pending production for the active wells in the selected period and the predicted production for the active wells in the selected period;
determining, with the one or more computer hardware processors, that the sum is greater than the area-level hydrocarbon production value for the selected period;
equalizing, with the one or more computer hardware processors, the sum of predicted production for the active wells in the selected period and the predicted production for the active wells in the selected period with the area-level hydrocarbon production value for the selected period; and assigning, with the one or more computer hardware processors, zero production to each new well for the selected period.

12. The computer-implemented method of claim 11, further comprising:
   determining, with the one or more computer hardware processors, that the sum is less than the area-level hydrocarbon production value for the selected period; and
   determining, with the one or more computer hardware processors, a difference between the sum of predicted production for the active wells in the selected period and the predicted production for the active wells in the selected period and the area-level hydrocarbon production value for the selected period; and
   assigning, with the one or more computer hardware processors, to each of the new wells in the selected period, a proportional hydrocarbon production value based on the difference.

13. The computer-implemented method of claim 12, further comprising, for each new well in the selected period:
   determining, with the one or more computer hardware processors, that the assigned proportional hydrocarbon production value to the new well in the selected period is less than an assigned proportional hydrocarbon production value to the new well in a previous period;
   identifying, with the one or more computer hardware processors, well test data associated with the new well; and
   based on the identified well test data, fitting, with the one or more computer hardware processors, the decline curve computer-generated model to the new well based at least in part on the well test data and the assigned proportional hydrocarbon production values of the new well in the selected period and the previous period.

14. The computer-implemented method of claim 12, further comprising:
   identifying, with the one or more computer hardware processors, no well test data associated with the new well; and
   based on the identification of no well test data associated with the new well, fitting, with the one or more computer hardware processors, the decline curve computer-generated model to the new well.

15. The computer-implemented method of claim 14, further comprising adjusting, with the one or more computer hardware processors, the decline curve computer-generated model for the new well based, at least in part, on the assigned proportional hydrocarbon production value of the new well in the previous period.

16. The computer-implemented method of claim 8, further comprising:
   identifying, with the one or more computer hardware processors, no new wells in the selected period; and
   based on the identification of no new wells in the selected period and based on the selected period being the first period, assigning, with the one or more computer hardware processors, a proportioned predicted production to the active well for the selected period, the proportioned predicted production based on the decline curve computer-generated model and the number of active wells.

17. The computer-implemented method of claim 1, wherein the time period comprises a month.

18. The computer-implemented method of claim 1, wherein the decline curve computer-generated model comprises an Arp's equation decline curve computer-generated model.

19. The computer-implemented method of claim 1, wherein the decline curve computer-generated model is defined, at least in part, by a maximum periodic hydrocarbon production value and at least one decline rate.

20. The computer-implemented method of claim 19, wherein the at least one decline rate comprises an initial decline rate and a decline rate over time.

21. The computer-implemented method of claim 3, further comprising:
   performing, with the one or more computer hardware processors, an iterative process of determining the allocated well-level hydrocarbon production values by iterating steps (vi)-(ix).

22. The computer-implemented method of claim 21, wherein iterating steps (vi)-(ix) comprises:
   determining, with the one or more computer hardware processors, new allocated periodic well-level hydrocarbon production values for each of the plurality of wells based on the determined allocated well-level hydrocarbon production values in a previous iteration of step (v);
   shifting, with the one or more computer hardware processors, the new allocated periodic well-level hydrocarbon production values for each of the plurality of wells to a first period of a number of periods associated with the particular area ID;
   aggregating, with the one or more computer hardware processors, the shifted new allocated periodic well-level hydrocarbon production values to generate new aggregated periodic area-level hydrocarbon production values; and
   determining, with the one or more computer hardware processors, a new decline curve computer-generated model for the new aggregated periodic area-level hydrocarbon production values.

23. The computer-implemented method of claim 1, wherein an area ID comprises a lease ID.

24. A computer program product encoded on a non-transitory storage medium, the product comprising non-transitory, computer readable instructions for causing one or more computer hardware processors to perform operations comprising:
   (i) identifying, with the one or more computer hardware processors, a selection of a particular area identification (ID) of a plurality of area IDs stored on the server;
   (ii) determining, with the one or more computer hardware processors, based on the selected particular area ID, a plurality of hydrocarbon production values that comprise periodic area-level hydrocarbon production values associated with the particular area ID and a plurality of wells associated with the particular area ID;
   (iii) determining, with the one or more computer hardware processors, a decline curve computer-generated model for the area-level hydrocarbon production values associated with the particular area ID;
   (iv) modeling, with the one or more computer hardware processors, the aggregated periodic well-level hydrocarbon production values with the determined decline curve computer-generated model;
   (v) determining, with the one or more computer hardware processors, allocated well-level hydrocarbon production values based at least in part on the selected decline curve computer-generated model to display at the client device; and generating, with the one or more computer hardware processors, a user-viewable output file that comprises the determined allocated well-level hydrocarbon data values from step (v).

25. A system of one or more computers comprising one or more computer hardware processors configured to perform operations including:
   (i) identifying, with the one or more computer hardware processors, a selection of a particular area identification (ID) of a plurality of area IDs stored on the server;
   (ii) determining, with the one or more computer hardware processors, based on the selected particular area ID, a plurality of hydrocarbon production values that comprise periodic area-level hydrocarbon production values associated with the particular area ID and a plurality of wells associated with the particular area ID;
   (iii) determining, with the one or more computer hardware processors, a decline curve computer-generated model for the area-level hydrocarbon production values associated with the particular area ID;
   (iv) modeling, with the one or more computer hardware processors, the aggregated periodic well-level hydrocarbon production values with the determined decline curve computer-generated model;
   (v) determining, with the one or more computer hardware processors, allocated well-level hydrocarbon production values based at least in part on the selected decline curve computer-generated model to display at the client device; and
   generating, with the one or more computer hardware processors, a user-viewable output file that comprises the determined allocated well-level hydrocarbon data values from step (v).

26. The system of claim 25, wherein the operation of determining a decline curve computer-generated model for the area-level hydrocarbon production values associated with the particular area ID comprises:
   determining, with the one or more computer hardware processors, the decline curve computer-generated model for the area-level hydrocarbon production values associated with the particular area ID based, at least in part, on a geology of a reservoir associated with the area ID.

27. The system of claim 25, wherein the operation of determining a decline curve computer-generated model for the area-level hydrocarbon production values associated with the particular area ID based, at least in part, on a geology of a reservoir associated with the area ID comprises:
   (vi) determining, with the one or more computer hardware processors, allocated periodic well-level hydrocarbon production values for each of the plurality of wells associated with the particular area ID;
   (vii) shifting, with the one or more computer hardware processors, the allocated periodic well-level hydrocarbon production values for each of the plurality of wells to an initial time period;
   (viii) aggregating, with the one or more computer hardware processors, the shifted allocated periodic well-level hydrocarbon production values to generate aggregated periodic area-level hydrocarbon production values; and
   (ix) determining, with the one or more computer hardware processors, the decline curve computer-generated model for the area-level hydrocarbon production values associated with the particular area ID based on the aggregated periodic well-level hydrocarbon production values.

28. The system of claim 25, wherein the operations further comprise:
   determining, with the one or more computer hardware processors, a number of periods associated with the particular area ID;
   determining, with the one or more computer hardware processors, a first period of the number of periods, the first period associated with a first area-level hydrocarbon production value; and
   determining, with the one or more computer hardware processors, a last period of the number of periods, the last period associated with a last area-level hydrocarbon production value.

29. The system of claim 28, wherein the operations further comprise:
   selecting, with the one or more computer hardware processors, a period of the number of periods, starting with the first period and ending with the last period;
   for the selected period, determining, with the one or more computer hardware processors, a total number of wells associated with the particular area ID; and
   for the selected period, determining, with the one or more computer hardware processors, a number of active wells associated with the particular area ID.

30. The system of claim 29, wherein the operations further comprise, based on the number of active wells being one active well in the selected period, assigning, with the one or more computer hardware processors, an area-level hydrocarbon production value in the selected period to the one active well.

31. The system of claim 29, wherein the operations further comprise, based on the number of active wells being more than one active well, for each active well in the selected period:
   determining, with the one or more computer hardware processors, that the active well has pending production in the selected period; and
   based on the active well having pending production in the selected period, assigning, with the one or more computer hardware processors, the pending preproduction to the active well.

32. The system of claim 31, wherein the operations further comprise:
   determining, with the one or more computer hardware processors, that the active well has no pending production in the selected period;
   based on the active well having no pending production in the selected period, determining, with the one or more computer hardware processors, that the active well has an assigned decline curve computer-generated model; and
   based on the active well having the assigned decline curve computer-generated model, determining, with the one or more computer hardware processors, a predicted production for the selected period for the active well.

33. The system of claim 32, wherein the operations further comprise:
   based on the selected period being subsequent to the first period, determining, with the one or more computer hardware processors, that the active well is associated with a predicted production from the assigned decline curve computer-generated model from a previous period in the number of periods;

proportioning, with the one or more computer hardware processors, the predicted production of the active well for the selected period based on the predicted production of the active well for the previous period; and assigning, with the one or more computer hardware processors, the proportioned predicted production to the active well for the selected period.

34. The system of claim 31, wherein the operations further comprise:

determining, with the one or more computer hardware processors, that the active well has no pending production in the selected period and no assigned decline curve computer-generated model; and based on the determination, flagging, with the one or more computer hardware processors, the active well as a new well for the selected period.

35. The system of claim 34, wherein the operations further comprise, for each new well in the selected period:

determining, with the one or more computer hardware processors, a sum of pending production for the active wells in the selected period and the predicted production for the active wells in the selected period;

determining, with the one or more computer hardware processors, that the sum is greater than the area-level hydrocarbon production value for the selected period;

equalizing, with the one or more computer hardware processors, the sum of predicted production for the active wells in the selected period and the predicted production for the active wells in the selected period with the area-level hydrocarbon production value for the selected period; and assigning, with the one or more computer hardware processors, zero production to each new well for the selected period.

36. The system of claim 35, wherein the operations further comprise:

determining, with the one or more computer hardware processors, that the sum is less than the area-level hydrocarbon production value for the selected period; and determining, with the one or more computer hardware processors, a difference between the sum of predicted production for the active wells in the selected period and the predicted production for the active wells in the selected period and the area-level hydrocarbon production value for the selected period; and assigning, with the one or more computer hardware processors, to each of the new wells in the selected period, a proportional hydrocarbon production value based on the difference.

37. The system of claim 36, wherein the operations further comprise, for each new well in the selected period:

determining, with the one or more computer hardware processors, that the assigned proportional hydrocarbon production value to the new well in the selected period is less than an assigned proportional hydrocarbon production value to the new well in a previous period;

identifying, with the one or more computer hardware processors, well test data associated with the new well; and based on the identified well test data, fitting, with the one or more computer hardware processors, the decline curve computer-generated model to the new well based at least in part on the well test data and the assigned proportional hydrocarbon production values of the new well in the selected period and the previous period.

38. The system of claim 37, wherein the operations further comprise:

identifying, with the one or more computer hardware processors, no well test data associated with the new well; and based on the identification of no well test data associated with the new well, fitting, with the one or more computer hardware processors, the decline curve computer-generated model to the new well.

39. The system of claim 38, wherein the operations further comprise adjusting, with the one or more computer hardware processors, the decline curve computer-generated model for the new well based, at least in part, on the assigned proportional hydrocarbon production value of the new well in the previous period.

40. The system of claim 32, wherein the operations further comprise:

identifying, with the one or more computer hardware processors, no new wells in the selected period; and based on the identification of no new wells in the selected period and based on the selected period being the first period, assigning, with the one or more computer hardware processors, a proportioned predicted production to the active well for the selected period, the proportioned predicted production based on the decline curve computer-generated model and the number of active wells.

41. The system of claim 25, wherein the decline curve computer-generated model is defined, at least in part, by a maximum periodic hydrocarbon production value and at least one decline rate.

42. The system of claim 41, wherein the at least one decline rate comprises an initial decline rate and a decline rate over time.

43. The system of claim 27, wherein the operations further comprise:

performing, with the one or more computer hardware processors, an iterative process of determining the allocated well-level hydrocarbon production values by iterating steps (vi)-(ix).

44. The system of claim 43, wherein the operation of iterating steps (vi)-(ix) comprises:

determining, with the one or more computer hardware processors, new allocated periodic well-level hydrocarbon production values for each of the plurality of wells based on the determined allocated well-level hydrocarbon production values in a previous iteration of step (v);

shifting, with the one or more computer hardware processors, the new allocated periodic well-level hydrocarbon production values for each of the plurality of wells to a first period of a number of periods associated with the particular area ID;

aggregating, with the one or more computer hardware processors, the shifted new allocated periodic well-level hydrocarbon production values to generate new aggregated periodic area-level hydrocarbon production values; and determining, with the one or more computer hardware processors, a new decline curve computer-generated model for the new aggregated periodic area-level hydrocarbon production values.

45. The system of claim 25, wherein an area ID comprises a lease ID.

* * * * *